United States Patent
Cook et al.

(10) Patent No.: US 10,733,988 B2
(45) Date of Patent: Aug. 4, 2020

(54) LIGHTING AND SOUND SYSTEM

(71) Applicant: Zuma Array Limited, London (GB)

(72) Inventors: Susan Cook, London (GB); Steven Kelly, London (GB); Morten Warren, South Oxshott (GB); Seong Min Hwang, London (GB); Marcus Hoggarth, St Albans (GB)

(73) Assignee: Zuma Array Limited, London (GB)

( * ) Notice: Subject to any disclaimer, the term of this patent is extended or adjusted under 35 U.S.C. 154(b) by 0 days.

(21) Appl. No.: 15/777,677

(22) PCT Filed: Nov. 17, 2016

(86) PCT No.: PCT/GB2016/053583
§ 371 (c)(1),
(2) Date: May 21, 2018

(87) PCT Pub. No.: WO2017/085487
PCT Pub. Date: May 26, 2017

(65) Prior Publication Data
US 2018/0350363 A1    Dec. 6, 2018

(30) Foreign Application Priority Data
Nov. 20, 2015 (GB) .................................. 1520503.2

(51) Int. Cl.
*G10L 15/00* (2013.01)
*G10L 15/22* (2006.01)
(Continued)

(52) U.S. Cl.
CPC ............ *G10L 15/22* (2013.01); *F21V 23/045* (2013.01); *F21V 23/0464* (2013.01);
(Continued)

(58) Field of Classification Search
CPC combination set(s) only.
See application file for complete search history.

(56) References Cited

U.S. PATENT DOCUMENTS 7,418,392 B1 * 8/2008 Mozer .................... G10L 15/26
315/307
9,472,196 B1 * 10/2016 Wang ...................... G06F 3/167
(Continued)

FOREIGN PATENT DOCUMENTS

WO    WO 2017/085487         5/2017

OTHER PUBLICATIONS

International Search Report and the Written Opinion dated Feb. 23, 2017 From the International Searching Authority Re. Application No. PCT/GB2016/053583. (11 Pages).
(Continued)

*Primary Examiner* — Vu B Hang

(57) ABSTRACT

A method of controlling a lighting and sound system comprising a controller and a plurality of lighting and sound devices 10 is provided. Each lighting and sound device 10 includes a light, a loudspeaker and a microphone 380. The method comprises receiving an audio instruction from a first user of the system at the microphone of a first device of the plurality of devices. The method further comprises processing the received audio instruction. The method further comprises transmitting the instruction from the first device to the controller. The method further comprises executing an action based upon the processed audio instruction.

20 Claims, 11 Drawing Sheets

(51) Int. Cl.
*F21V 33/00* (2006.01)
*F21V 23/04* (2006.01)
*H04R 1/02* (2006.01)
*H05B 47/12* (2020.01)
*F21V 29/70* (2015.01)
*G06F 3/16* (2006.01)
*G10L 15/08* (2006.01)
*G10L 21/0232* (2013.01)
*H03G 5/16* (2006.01)
*F21Y 115/10* (2016.01)
*G10L 21/0208* (2013.01)

(52) U.S. Cl.
CPC .......... *F21V 23/0471* (2013.01); *F21V 29/70* (2015.01); *F21V 33/0056* (2013.01); *G06F 3/165* (2013.01); *G10L 15/08* (2013.01); *G10L 21/0232* (2013.01); *H03G 5/165* (2013.01); *H04R 1/028* (2013.01); *H05B 47/12* (2020.01); *F21V 23/0457* (2013.01); *F21Y 2115/10* (2016.08); *G10L 2015/088* (2013.01); *G10L 2015/223* (2013.01); *G10L 2021/02082* (2013.01)

(56) References Cited

U.S. PATENT DOCUMENTS

| | | |
|---|---|---|
| 2009/0196016 A1 | 8/2009 | Massara et al. |
| 2009/0207607 A1 | 8/2009 | Haase et al. |
| 2011/0075396 A1* | 3/2011 | Sun ........................ H04R 1/028 362/86 |
| 2011/0151782 A1* | 6/2011 | Sun ..................... H04M 1/6041 455/41.2 |
| 2013/0002687 A1 | 1/2013 | Conti |
| 2014/0285999 A1 | 9/2014 | Luna et al. |
| 2014/0354160 A1* | 12/2014 | Aggarwal .......... H05B 37/0227 315/152 |
| 2015/0106089 A1* | 4/2015 | Parker .................. G06F 1/3206 704/235 |
| 2015/0331666 A1 | 11/2015 | Bucsa et al. |

OTHER PUBLICATIONS

Patents Act 1977: Search Report Under Section 17(5) dated Feb. 4, 2016 From the Intellectual Property Office of the United Kingdom of Great Britain Re. Application No. GB1520503.2. (4 Pages).

* cited by examiner

LIGHTING AND SOUND SYSTEM

RELATED APPLICATIONS

This application is a National Phase of PCT Patent Application No. PCT/GB2016/053583 having International filing date of Nov. 17, 2016, which claims the benefit of priority of UNITED Kingdom Patent Application No. 1520503.2 filed on Nov. 20, 2015. The contents of the above applications are all incorporated by reference as if fully set forth herein in their entirety.

FIELD AND BACKGROUND OF THE INVENTION

This invention relates to a lighting and sound system, in particular having a plurality of combined light and sound devices that may be controlled using voice commands.

Integrated light and loudspeaker systems are known in the art. For example, US-A-2007/222631 describes a system having a plurality of devices, each of which is capable of producing both light and sound. The system of US-A-2007/222631 is arranged to receive an audio signal wirelessly from a sound source, and includes a repeater that sends the received audio signal to others of the devices in the system.

In prior art systems such as the one mentioned above, there are differing power requirements for the components within the unit. Mains power at a higher voltage therefore has to be reduced with a transformer or power convertor placed in a junction box. Lower voltage power to the lighting elements is brought from the electrical junction box to the LEDs. This additional wiring can be expensive and time consuming to install.

It is also known to control the light settings in a system comprising a plurality of lights, such as, for example, a series of LEDs mounted within a ceiling void of a domestic dwelling such as a living room or kitchen. For example, a user may wish to illuminate particular areas (for example, for task lighting) or to adjust the brightness and colour of the lights (for example, for ambience and mood lighting). Such control may be effected by the provision of control panels that replace the existing light switch. However, installation of these panels can require additional wiring, again leading to increased cost and complexity in installation.

An alternative approach to the control of lighting in a distributed lighting system may be to provide a wireless controller. Such wireless controllers may be in the form of a dedicated infrared or Bluetooth remote control that forms a direct data connection with each light in order to control its individual light output.

Still a further alternative approach to the problem of control in a distributed lighting system may be to connect all of the individual lights to a wireless network, and then to provide a smartphone application that is able to control the devices when connected to the same network. For example, in a domestic installation, the lights may each be linked via an 802.11 wireless network or the like to a smartphone that is connected to or in communication with that wireless network. One such current system is offered by Belkin International, Inc under the Wemo™ brand. Such systems, however, require a user to have a smartphone running a dedicated application, and also typically require that the smartphone user be granted access to the router that controls the lights. Thus, in practice, control of such systems may be restricted to a limited number of users.

Distributed loudspeaker systems are also known, with wired and/or wireless connections between an audio source and between individual loudspeakers. Such systems are typically very expensive, and often require a significant amount of installation work to be carried out on walls and/or ceilings. There are also particular challenges with the control and distribution of sound within a building; for example, permitting different content to be supplied to different rooms may require multiple separate controllers and receivers within a single building.

With a system having individual devices containing both a light and a loudspeaker system control is complicated still further. Typically, it will be desirable separately to control the power to the light and loudspeaker elements of the device. For example, it may be desirable to control the volume of the sound output from the loudspeakers, independently of the control of the light output (on/off/dimmed and the like). Achieving such individual, independent control of each separate combined light and loudspeaker device becomes ever more challenging as the number and distribution of devices increases, resulting in potentially significant installation costs due to rewiring, wall and ceiling modifications, etc.

US 2011/151782 describes a plurality of illumination devices, each of which comprises a microphone and a speaker. The object of the system is to be used as a hands-free system for phone calls. However, the quality of the light, sound produced by this system is not sufficient for high-end applications. Moreover, as a result of issues relating to the management of power and heat in these devices, the devices can only operate at low power. This system also requires the user to have their phone in their possession in order to take or make a call using the system.

US 2013/002687 describes a system for providing adjustable lighting and delivering multimedia content that can be mounted on a pre-existing lamp-holder. The devices each include a microphone for capturing and/or recording external audio sources. This document also discusses interaction from gestural and vocal interactions of the user in the proximity of the device.

This system has a projector in its removable top half, to project on the inside of a lamp shade. It also has a diffuse ring of ambient light. This quality of this light may not be suitable for certain applications, such as task lighting. The device has one small microphone, which is non-directional. The bulb can use a battery as a power source when mains power to the light is switched off. As with the system described in US 2011/151782, the devices can only operate at low power due to heat management issues arising from packaging a transformer and electronics in the bulb. Standard bulb fittings are typically heat-insulating and therefore the devices must operate at low power, for safety reasons.

US 2014/285999 describes combination speaker and light source devices powered using a light socket. The devices include sensors, which may include a microphone to detect speech. Speech commands are mentioned in the document. However, the system must pass the speech command on to a speech-to-text device, in order to process it. This system further has the power and heat management drawbacks of being packaged in a bulb and using a standard bulb socket described above. Combined loudspeaker and light devices in the form of bulbs for standard light fittings are limited in physical size and hence audio volume. Moreover, the light or sound emitted by the bulb may be obstructed by the light fitting.

The present invention seeks to address these problems with the prior art.

SUMMARY OF THE INVENTION

According to a first aspect of the present invention, there is provided a method for controlling a lighting and sound system in accordance with claim 1. A combined light and sound system in accordance with claim 24 is also provided.

Controlling light and loudspeaker devices using an audio input provides for increased flexibility and ease of use. For example, such a system need not be reliant on dedicated remotes and external applications to control the light and loudspeaker elements of the devices. Some previous systems utilised mobile applications to control the system. Such systems rely on the user having their phone on them at all times so that they can control the system when required. In contrast, by providing a system that may be controlled by voice commands, the user can control the system even if their phone is charging in a different location, for example. Additional remote controls or smartphone applications are not required to operate this system (but may nevertheless be provided, for convenience).

The system does not require the user to be near a mobile device or remote control. In situations where it is inconvenient, difficult or impossible to obtain or use a remote device this is particularly useful. Examples may include nursing a baby, bathing, having fallen down, or engaged in a conversation.

A method of controlling a lighting and sound system comprising a controller and a plurality of lighting and sound devices is also provided. Each device includes a light, a loudspeaker and a microphone. The method comprises: receiving an audio instruction from a first user of the system at the microphone of a first device of the plurality of devices; processing the received audio instruction; transmitting the instruction from the first device to the controller; and executing an action based upon the processed audio instruction.

Executing the action may comprise executing the action at the first device for control of the light and/or loudspeaker of the first device.

The method may further comprise transmitting the instruction to a second device of the plurality of lighting and sound devices and executing the action may further comprise executing the action at the second device for control of the light and/or loudspeaker of the second device.

The method may further comprise transmitting the instruction to an application running on a processor and executing the action comprises executing the action at the application.

The application may be an application for playing music and executing an action may comprise playing audio from the application for playing music through the loudspeaker of one of more of the lighting and sound devices.

The application may be a search engine and executing the action may comprise searching for a phrase specified by the first user in the audio instruction and delivering results to the first user.

Delivering results to the first user may comprise processing results from the search engine, performing text-to-speech on the processed results to generate audio and playing the audio through the loudspeaker of one of more of the lighting and sound devices.

The audio instruction may comprise: a voice command; speech data; a percussive noise; and/or a musical or vocal tone. For example, the audio instruction may be a voice command to use a search engine followed by a phrase to search, alternatively the audio instruction may be a question that the controller will implicitly interpret as a command to search for a certain phrase using a search engine. Alternatively the audio instruction may comprise a clap, click of the fingers, whistle and the like.

If the audio instruction comprises a voice command or speech data, processing the received audio instruction may comprise performing voice recognition on the voice command. Voice recognition may be performed in a number of ways. For example, voice recognition may be performed by a natural language engine. Natural language engines can use a variety of approaches to perform voice recognition. These include neural networks and contextual bag of words approaches. Other approaches include, but are not limited to, command and control, locally processed, cloud processed, neural net, deep learning, and the like. Preferably, the device will process the voice command locally but can refer to cloud-based voice recognition services, if required. One advantage of processing the command locally is that the latency between the command being issued and being executed will be reduced. Moreover, by processing the command locally, voice data does not need to leave the private network unless required (for instance for a phone call). This ensures that private voice data is not sent over a public network. Speech data is only transmitted after it has been processed and only if it is required to be sent externally.

Processing the received audio instruction may further comprise matching the voice command to a trigger phrase from a database of trigger phrases. Preferably, a strong trigger phrase for voice commands is required. In other words, the trigger phrase is easily distinguished from other trigger phrases. Moreover, users speaking to each other, without attempting to engage the system, should preferably not accidentally trigger the system to take an action. This could alternatively be performed by addressing the system using a distinctive name, for example. One or more trigger phrases may be used to engage the system.

Executing the action may comprise updating the database of trigger phrases.

Processing the received audio instruction may comprise performing echo cancellation on the received audio instruction.

Each of the devices may include a second microphone and the method may further comprise receiving the audio instruction at the second microphone. Processing the audio instruction may comprise performing beam forming using the audio received at both microphones.

Executing an action may comprise initiating a voice communication between the first user and a second user. The method may then further comprise transmitting audio information received by the microphone of one or more of the devices to the second user so that the second user can hear the first user. The method may further comprise transmitting audio information from the second user to one or more of the lighting and sound devices and playing the audio through the loudspeaker of the one or more devices so that the first user can hear the second user.

The second user may be a user of a telecommunications device and the voice communication may be a telephone call. The method therefore enables the user to place or receive a call conveniently. For example, the user may be kneading bread and so unable to place or receive a call using a telephone receiver. This system allows them to do so without having to clean their hands and stop what they are doing. Most hands-free sets require at least some physical interaction on the part of the user in order to place or receive a call. Advantageously, the method described in this application allows the user to place/receive a phone call and perform many other actions using only audio instructions.

Alternatively, the second user may be a user of the lighting and sound system. In other words, the system may be used as an intercom system to allow users in different parts of the house to speak to each other in a convenient way.

Executing an action may comprise playing audio through the loudspeaker of one or more of the lighting and sound devices.

Executing an action may comprise adjusting one or more audio parameters of the loudspeaker of one or more of the lighting and sound devices. The audio parameters may comprise equalisation settings.

Executing an action may comprise adjusting an optical output of the light of one or more of the lighting and sound devices.

The system further may comprise a controlling unit and the method may further comprise sending an indication of a position of a switch and/or dial from the controlling unit to the controller. The method may then further comprise: adjusting an optical output of the light of one or more of the lighting and sound devices; and/or adjusting one or more audio parameters of the loudspeaker of one or more of the lighting and sound devices.

A lighting and sound system comprising: a plurality of lighting and sound devices, each device including a light, a loudspeaker and a user input detector is also provided. The system further includes a controller, in communication with each of the plurality of lighting and sound devices. The controller is configured to receive an audio instruction from the audio detector of one or more of the lighting and sound devices, and to execute an action based upon the audio instruction. The user input detector of each lighting and sound device comprises a microphone.

Executing the action may comprise controlling the output of the light and/or loudspeaker of one or more of the lighting and sound devices.

The user input detector of each lighting and sound device may further comprise a programmable low noise amplifier, connected to the output of the microphone. The user input detector of each lighting and sound device may further comprises an analog filter, connected to the output of the microphone.

Each device may further comprises a second user input detector that comprises elements that are equivalent to those of the first user input detector and wherein the second user input detector is spaced physically apart from the first user input detector. In other words, each device has two microphone arrangements. Advantageously, beam forming can then be used to amplify audio signals coming from certain directions and to ascertain information relating to where the audio signal came from.

Each lighting and sound device may further include a network connection module that is configured to communicate with the network connection module of one of the other devices and/or a network router.

Each lighting and sound device may further include a connectivity module that is configured to communicate with the connectivity module of one of the other devices in the system. The connectivity module of each lighting and sound device may be configured to communicate using a protocol selected from one or more of: Bluetooth; Bluetooth low energy; Z-wave; Zigbee; LowPan; PLCBUS; X10; and 802.11 "WiFi". This list is intended to provide examples and is not exhaustive.

The light of each lighting and sound device may comprise an LED module. The LED module of each lighting and sound device may comprise a dual channel LED driver, a plurality of high temperature LEDs and a plurality of low temperature LEDs. The LED module of each lighting and sound device may further comprise a LED temperature sensor.

Each lighting and sound device may further include an audio out module. The audio out module of each device may comprise an audio codec, an amplifier and an analog filter. Each lighting and sound device may further include an audio driver, connected to the output of the audio out module. The audio driver of each lighting and sound device may be a full range driver or may comprise a crossover, a first driver for low to middle frequencies and second driver for high frequencies.

Each lighting and sound device may further comprise a status indicator. This could be in the form of a low brightness LED, for example.

The system may further comprise a power supply that is configured to provide a constant voltage and/or a constant current to each lighting and sound device.

Each lighting and sound device may further comprise one or more sensors. For example, the devices may contain, a proximity sensor, a light sensor and/or a temperature sensor.

The system may further comprise a controlling unit that includes a switch and/or dial. The controlling unit may be configured to communicate the position of the switch and/or dial to one or more of the lighting and sound devices. Additionally or alternatively, the controlling unit may be configured to communicate the position of the switch and/or dial to a database. One or more of the devices may then be configured to read the position of the switch and/or dial from the database.

On the basis of the position of the switch and/or dial, the devices may be configured to: adjust an optical output of the light; and/or adjust one or more audio parameters of the loudspeaker.

The controlling unit may comprise a transmitter that is configured to communicate the position of the switch and/or dial to one or more of the devices. This may be a wired or a wireless communication.

The controlling unit may comprise a switch having an on position and an off position. The controlling unit may be configured to facilitate the supply of power to one or more of the lighting and sound devices in both the on and off positions. Advantageously, the switch then enables to user to control the lights in the manner in which they would in a standard system, without cutting power to the loudspeaker elements when the lights are switched off.

The controller may be configured to communicate the position of the switch and/or dial to the controller. The controller may then be configured to adjust an optical output and/or one or more audio parameters of one or more of the lighting and sound devices on the basis of the position of the switch and/or dial.

The user may reset or power down the system by toggling the switch a predetermined number of times. This may be performed by resetting or turning off the power to one or more of the lighting and sound devices. Alternatively, this may be performed by sending a reset instruction to one or more of the lighting and sound devices.

The loudspeaker of each device may have a loudspeaker diaphragm. The light of each device may be positioned radially inwardly of the loudspeaker diaphragm of that device.

Each device may further comprise a heat removal element. The loudspeaker diaphragm of each device may extend between a front and a rear part. The heat removal element of each device may comprise a heat sink mounted behind the rear part of the loudspeaker diaphragm of that device.

The heat removal element of each device may comprise a heat removal column in thermal connection with the heat sink and the light of that device. The heat removal column may have a first, proximal end that is adjacent to the heat sink and a second, distal end that is spatially separated from the heat sink.

This specialised heat removal system efficiently dissipates heat generated by the device. Advantageously, devices according to the present invention may therefore operate at higher power than retrofitted bulb-type devices that fit into standard (insulating) bulb fittings. This is made possible, at least in part, by the devices of the present invention being in the form of ceiling luminaries, rather than bulbs that attach to standard fittings.

In addition to providing ambient lighting, the devices may also provide targeted task lighting. This is possible because they are able to operate at higher power than standard solutions. The devices can therefore replace spot lighting and may be provided with a lens. In contrast to some previous devices, the devises of this system provide good task or spot lighting because they do not require a reflector or diffuser arrangement. The devices of this system operate with an unobstructed path for light travelling from the LED, via the lens, to the environment.

Each device may further comprise a speaker grille mounted in front of a front surface of the loudspeaker. The grill allows sound to emanate from the device, whilst hiding the moving membrane from view.

The system may further comprise a power supply unit that is electrically connected to one or more of the lighting and sound devices and configured to supply electrical current in one or more of several forms to the device. The light of the device and the loudspeaker of the device may be powered by different forms of current. For example, the power supply may supply alternating and/or direct current and may supply current at a range of predetermined fixed voltages and/or predetermined fixed currents. The power supply unit is preferably configured to receive mains current. The power supply unit may be configured to be powered by the local mains current in the territory in which the device is sold. Alternatively, the power supply unit may be configured so that is able to be powered by the local mains current of any territory.

Each device may have a power supply unit and each power supply unit may physically located within or physically connected to a main housing of the device. Alternatively, the power supply unit may be physically separate from the device. Having the power supply unit separated from the other components of the device simplifies servicing and replacement of components. On the other hand, supplying the power supply unit as an integral part of the device reduced the overall number of components and therefore simplifies installation of the system. Supplying the power supply unit as an integral part of the device provides a simple system without the requirement for additional wiring to the individual devices.

Alternatively, the power supply unit may be configured to supply electrical current to a plurality of lighting and sound devices. Advantageously, a cheaper system is provided if fewer power supply units are required.

The system may further comprise satellite devices that are managed by the controller. These devices may be manufactured by third parties and may include smart bulbs, wireless speakers and the like. Advantageously, this allows the system to integrate with existing systems in the user's house.

Other preferred features and advantages of the invention will be apparent from the appended claims.

BRIEF DESCRIPTION OF THE SEVERAL VIEWS OF THE DRAWINGS

The present invention may be put into practice in a number of ways, and some specific embodiments will now be described by way of example only and with reference to the following drawings.

DESCRIPTION OF SPECIFIC EMBODIMENTS OF THE INVENTION

Device

Figure 1:
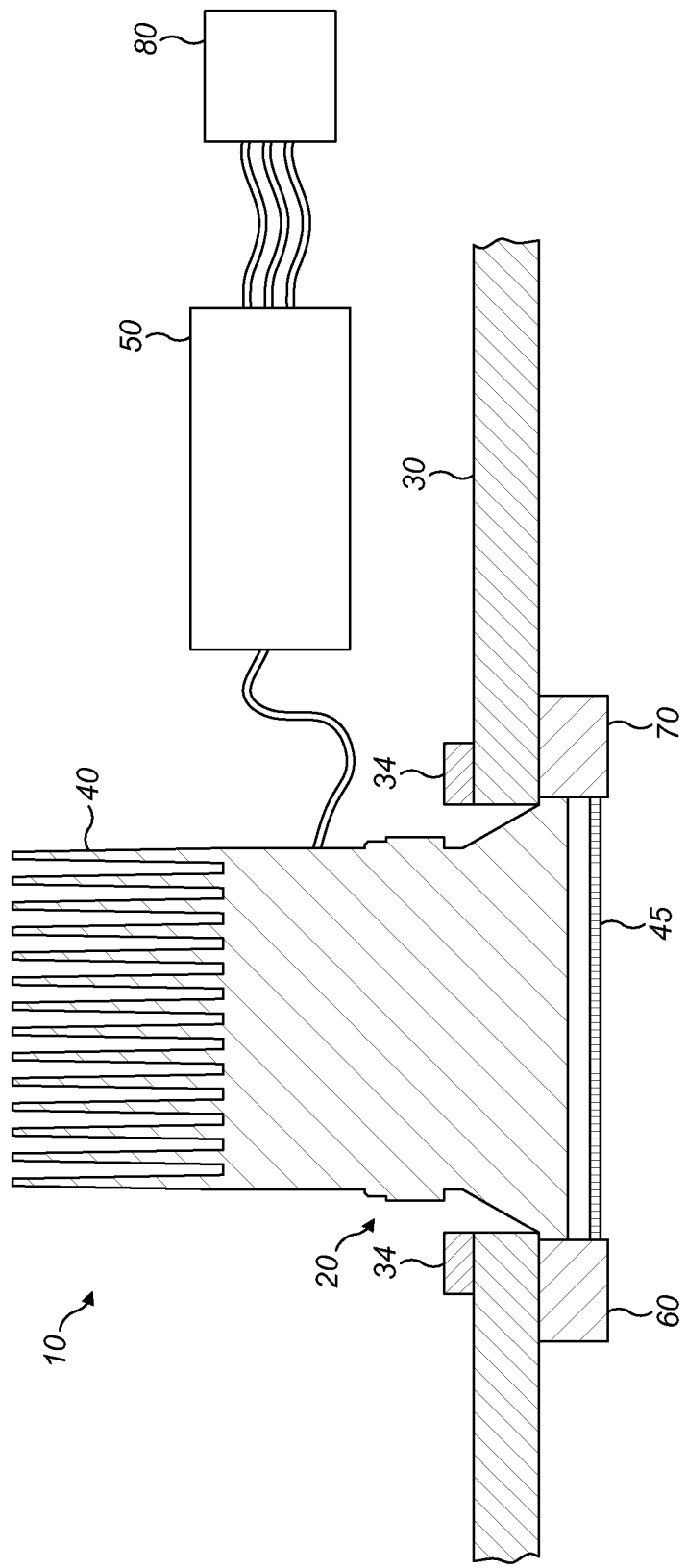
FIG. 1 shows a combined light and loudspeaker device embodying aspects of the present invention, in schematic form, mounted within a ceiling void along with a device controller/driver.

FIG. 1 shows a schematic diagram of a lighting and sound device 10 that includes a light source, loudspeaker and user input detector embodying the present invention. The lighting and sound device 10 comprises a loudspeaker driver 20, which may be positioned within an aperture formed in a ceiling 30 such that the device 10 is sub-flush with the ceiling 30. The loudspeaker driver 20 may be securely mounted to the ceiling 30 via a fixing 34. The fixing 34 can be damped to prevent vibration transmission to the ceiling 30. The fixing 34 can also be made of an intumescent material to serve as a fire barrier.

The system of the present invention is installed in existing lighting space in the ceiling void. Therefore, in contrast to prior art systems, this system is effectively invisible as the devices are fitted out of eye level and fit within the footprint of existing in-ceiling luminaries. Moreover, the devices can be easily retrofitted to the existing infrastructure of the house. Additional boxes do not need to be located in the room, which can be unattractive. Moreover, additional wiring is not required. In particular, loose wiring required to power standalone speaker or microphone devices that are placed in a room can be unattractive or dangerous. This system obviates the need for such additional wiring.

The loudspeaker driver 20 includes a light source and a loudspeaker, which are not visible in FIG. 1. A heat sink 40 for removal of heat from the device may be mounted on the loudspeaker driver 20, in a cavity behind the ceiling 30. A speaker grille 45 may be mounted in front of a front surface of the loudspeaker driver.

A power supply unit 50 is preferably electrically connected to the lighting and sound device 10 and comprises electronic components used to produce the electrical signals that power the device and/or devices 10. The power supply unit 50 is preferably capable of supplying more than one power signal. Electrical signals used to power the device may be different for each of the lighting, loudspeaker, and system on chip (SoC) elements. For example, some elements may require alternating current, whereas some elements may require direct current and each element may have different voltage requirements. The power supply unit itself is preferably mains powered and the mains feed powering each power supply unit may be routed with a star or daisy chain topology, in accordance with wiring regulations.

Preferably, a dedicated power supply unit (which is capable of supplying all the required currents and/or voltages for a device) is connected to each lighting and sound device by wiring. This power supply unit is preferably external to an enclosure containing the lighting and loudspeaker elements. However, the power supply may be an integral part of the device itself. Having the power supply unit separate from the lighting and loudspeaker elements provides an easier arrangement for servicing. Moreover, heat generated by the power supply can be more easily dissipated if the power supply is provided separately. The power supply unit may be a physical part of the device (mechanically fastened to the light and loudspeaker enclosure with the wiring fixed in place, for example) or may be a separate entity placed in the cavity behind the ceiling 30 and electrically connected to the lighting and sound device with external wiring. Having the power supply unit 50 removed from the device 10 further simplifies servicing and replacement of components. Whereas, supplying the power supply unit 50 as an integral part of the device simplifies installation of the system. This is at least because the number of additional components that need to be installed is reduced. Moreover, supplying the power supply unit as an integral part of the device provides a simple system without the requirement for additional wiring in the ceiling cavity to the individual devices.

In an alternative embodiment, rather than each device having a dedicated power supply unit, a power supply unit may service several or all devices. Advantageously, a cheaper system is provided if fewer power supply units are required.

In a further alternative embodiment, the controller (for example, the system on chip) may be physically located within the power supply unit.

A first transceiver 60 is mounted adjacent the aperture and on the ceiling 30 on the side facing into the room of which the ceiling 30 is a part. The transceiver 60 includes a user input detector, which picks up user input (for example, a microphone may be used to pick up voice commands, claps and/or whistles made by the user). A second transceiver, 70 may further be included in the device. Advantageously, this may allow the device to ascertain the direction from which the sound came and/or to use post-processing to amplify sounds that come from a particular direction. The second transceiver may be mounted opposite the first transceiver.

The inputs are provided from the transceiver 60 (or transceivers 60, 70) to a controller. The controller may be located in a power supply unit 50. Alternatively, the controller may be a lighting and sound device that is designated as the house coordinator unit or a room coordinator unit, as discussed later. The transceiver 60 (or transceivers 60, 70) may be connected to the controller via wiring (for example, cable harness) or could be connected to the controller wirelessly by a wireless transmitter/receiver of the device.

Each input received by the transceiver will preferably be digitalized and processed using a processor of the lighting and sound device. The device may then determine what action is required and then executing an action itself and/or transmit the processed input to a different device. This will depending on the nature of the input. For example, the device may determine that the input should be transmitted to the room and/or house coordinator. As an alternative example, a device acting as room coordinator that receives an instruction to turn on the lights in that room (for example, as a voice command or a clap) may process the input and turn all the lights in that room on, without transmitting the instruction to the house coordinator.

A device may receive an input, process it and then determine that it does correspond to a logical event and so does not require any action. For example, the device may determine that the temperature in the room has changed slightly. This may in some circumstances require an action, but will most likely not result in any logical event that requires action and/or requires the event to be communicated to one or more devices in the network. Equally, the level of the information from an input interpreted by a device that is transmitted to other devices can vary. For example, a room coordinator device may determine that a particular user is in the north corner of the room. However, depending on the configuration of the system, it may only report to the house coordinator that the particular user is in the room.

A further example could be an end unit receiving a voice command to mute all speakers in the house. The device may not take any action itself but may transmit the processed input to the house coordinator unit, which would then take the required action. The system is intelligent and is aware of its own structure. Therefore the system can make decisions and execute commands at the appropriate level.

Alternatively, inputs received by a device may be sent to the controller and digitized and processed by the controller. These inputs may provide instructions to the controller to control the one or more of the lighting and sound devices 10. For example, to adjust the volume of the loudspeaker or the brightness of the light source. Additionally or alternatively, the inputs may be used to control other elements of the system, for example, the inputs may be sent to external applications. One specific example is that the user is able to change the music that is currently playing in a particular room by specifying the track to play.

By way of example, a device may receive an audio signal and process it using voice recognition to identify the words said by the user. The device may then compare this against a profile of known commands and identify the command as an instruction to skip to the next track. This instruction would then be communicated through the network to where it is required, in this case, the users' music application. Alternatively, the device may receive an audio signal and send this to a separate entity for voice recognition processing. Voice recognition is preferably performed locally by the device. Alternatively, the audio data can be sent to a location over the internet for voice recognition to be performed (this is often referred to as a "cloud service"). A cloud service may be able to perform voice recognition quickly and accurately using advanced software. However, there is likely to be a delay caused by transmission of the audio over the internet. The exact arrangement used will depend on the quality of the user's internet connection and the quality and processing requirements of the voice recognition software, as compared to the processing capabilities of the devices.

This allows, for example, the user to instruct the controller to turn off all the light sources in the system or to play certain music in certain locations.

A further example is that the user is able to request an internet search, which would be performed by the system and the interpreted results could be presented to the user verbally through the speakers. Such a system may incorporate intelligent syntactical analysis to determine what information the user is requesting and present the results accordingly. For example, the user may ask "What is the capital city of Honduras". The system may then interpret the question, perform an internet search, interpret the results and perform text-to-speech on the answer. The result would be that the system announces "The capital city of Honduras is Tegucigalpa", in the vicinity of the user that asked the question. It may also be desired that the system confirms what question they are searching, so that the user may cancel and reissue the command if there has been an error in the speech to text processing. The system need not be limited to searching the internet. For example, the system may enable the user to post to social media, send electronic messages or control external hardware connected to the internet (for example, the user may be able to issue a command to lock a car that is connected to the internet via a telecommunications network). This interfacing flexibility is particularly useful given the prominence of new technologies being accessible via the internet or local network in the manner of an internet of things or a smart home.

The system therefore proves a gateway for the user to access a number of other services that may be local (such as light/speaker options or thermostat controls for the house) or remote (such as internet searches and making telephone calls).

Network

Figure 2:
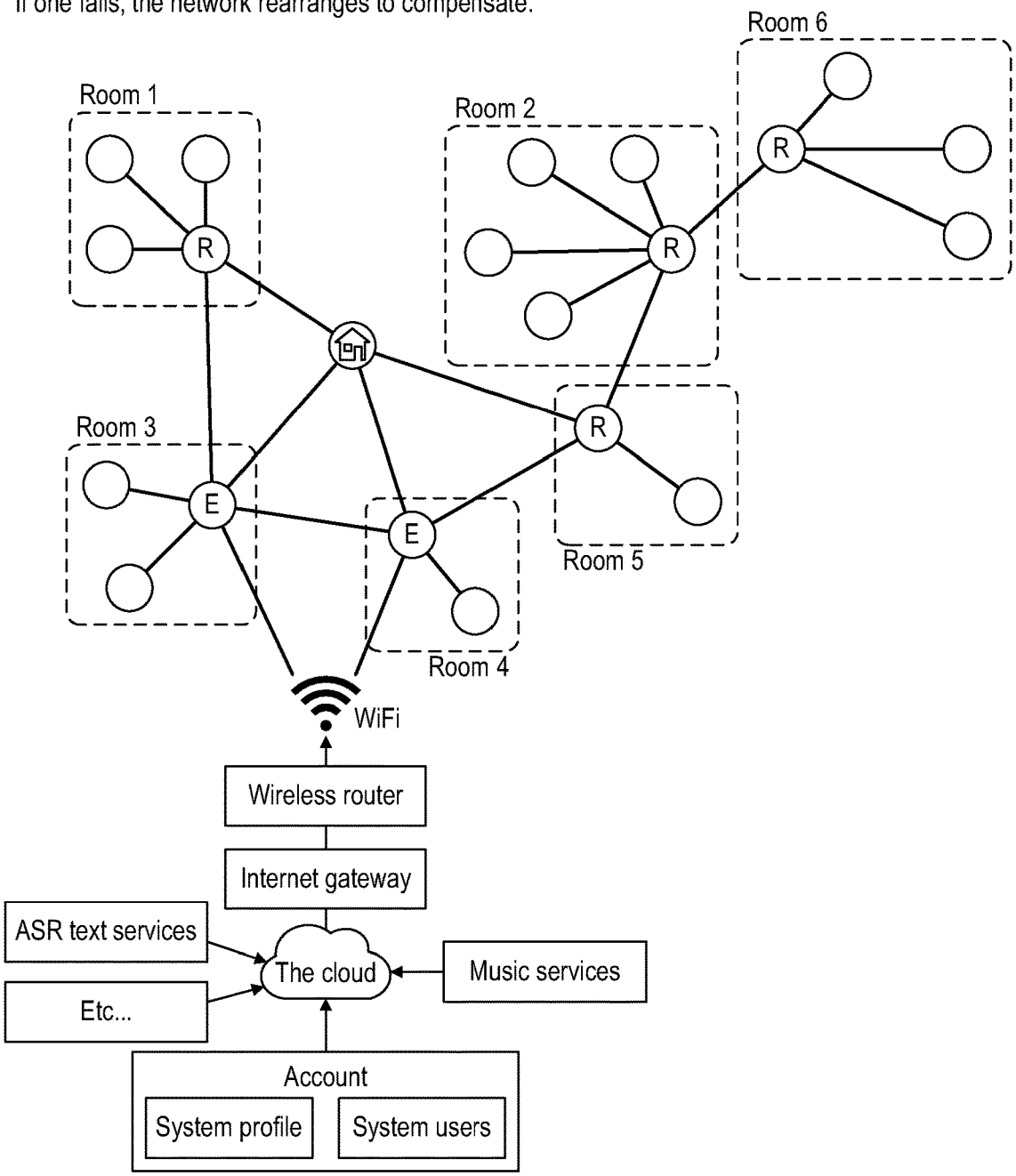
FIG. 2 shows a system diagram of a network of individual devices.

FIG. 2 shows a system diagram of an example network of lighting and sound devices. By enabling direct communication between the combined light, loudspeaker and microphone devices in the system (without having to communicate via the user's home wireless router) a more scalable system is produced. An ad-hoc network that is set up in this way may provide additional benefits in terms of range. For example, devices that are remote from the user's home router may have poor signal quality and may not be able to reliably receive commands in standard network-based systems. In contrast, a flexible networking system may enable communication to remote devices via other devices and so a more reliable and scalable system is produced.

Preferably, particular devices in the network are assigned specific additional roles. The devices could self-arrange into a flexible network by assigning roles to particular devices automatically, without the need for a user to configure the devices to perform these roles. Alternatively they may be manually configured. Automatic assignment of roles may be performed on the basis of, for example, which device has the best wireless signal strength to the wireless router, which device is physically closest to the centre of the room, which device has the best connection to the house coordinator unit or another room coordinator unit and/or which device is connected to every other device in the network with the lowest hop count (where the hop count is the number of intermediary devices a transmission must pass through in order to travel from source to destination).

One or more of the devices may be assigned as an edge unit. It is the role of an edge unit to establish a direct connection with the user's wireless router. For example, this may be a 802.11 wireless router. Communications to and/or from external entities are sent to the edge unit (or units) of the network first and then distributed to the required devices in the network via data connections between devices. These external entities could include, for example, applications on a user's smartphone connected to the wireless network. The external entities could also include resources belonging to content providers that are connected to the network via the public internet, for example, music streaming services or cloud voice recognition services. This unit therefore provides an access point to bridge the local area network to the public area network and internet.

Each room preferably has a room coordinator unit. This unit is responsible for managing the state of all the other devices in the room and relaying communications from these devices to where they are needed.

Preferably, the network also contains a house coordinator unit. This device is responsible for managing the states of all the other devices in the network and making decisions in a hierarchical way.

In a particular implementation of the system, a central database of the current status of all the devices in the network is provided. This database is called the "home profile". All the devices in the network check the home profile regularly and update their status accordingly. The house coordinator and room coordinator units may update the home profile to control the other devices in the system.

Roles are not mutually exclusive. For example, an edge unit may also be a room coordinator unit and/or a house coordinator unit. Likewise, a room coordinator unit may also be a house coordinator unit.

A flexible self-arranging network is particularly advantageous because devices may be added or removed from the network and the remainder of the devices would rearrange themselves accordingly in the network structure. Roles may be flexibly reassigned if, for example, conditions in the network change so that previously strong wireless signals become too weak to use effectively. The devices together create a wireless hierarchical network (preferably using standard 802.11 architecture). Preferably, the devices have a common service set identifier (SSID). This SSID is preferably different to the SSID of the user's home WiFi network so that an additional network is created in the house by the network of devices. This prevents heavy traffic on one network (such as communication between the light and loudspeaker devices) form adversely affecting the other network. The wireless hierarchical network created by the devices preferably shares a connection gateway connection into the house with the home WiFi router.

The network of devices could be used to relay communications from the user's personal electronic devices to the user's wireless network. For example, the devices could be used to extend the range of the user's wireless network so that wireless internet access may be provided in areas that would otherwise have poor wireless signal.

The system may have a vocabulary of custom voice commands, noises, gestures and triggers (for example, changes in temperature or other conditions). The vocabulary is part of the user interface. These are configurable by the user and each element in the vocabulary may result in a specific action being performed by the system. In this way, the user may "train" the system to respond in a desired way. For example, a clap may cause the lights in the room to turn on or off. A voice command to "dim lights" could activate a pre-set lighting mode. The pitch of a whistle could control the brightness of the lights or volume of the speakers. Moreover, the system may be manually configured to respond to particular sounds. For example, the system may respond to the sound of a door opening or the cry of a baby.

Preferably, the system is also compatible with devices made by other manufacturers (for example, smart bulbs and wireless hue colour bulbs). Such lights on the same lighting circuit or within the same network will preferably be controllable within the system in the same way as the devices described in this application. This may include controlling third party devices with voice commands, claps (and other sounds), gestures and wireless enabled switches (described below), for example.

Switch

Figure 3:
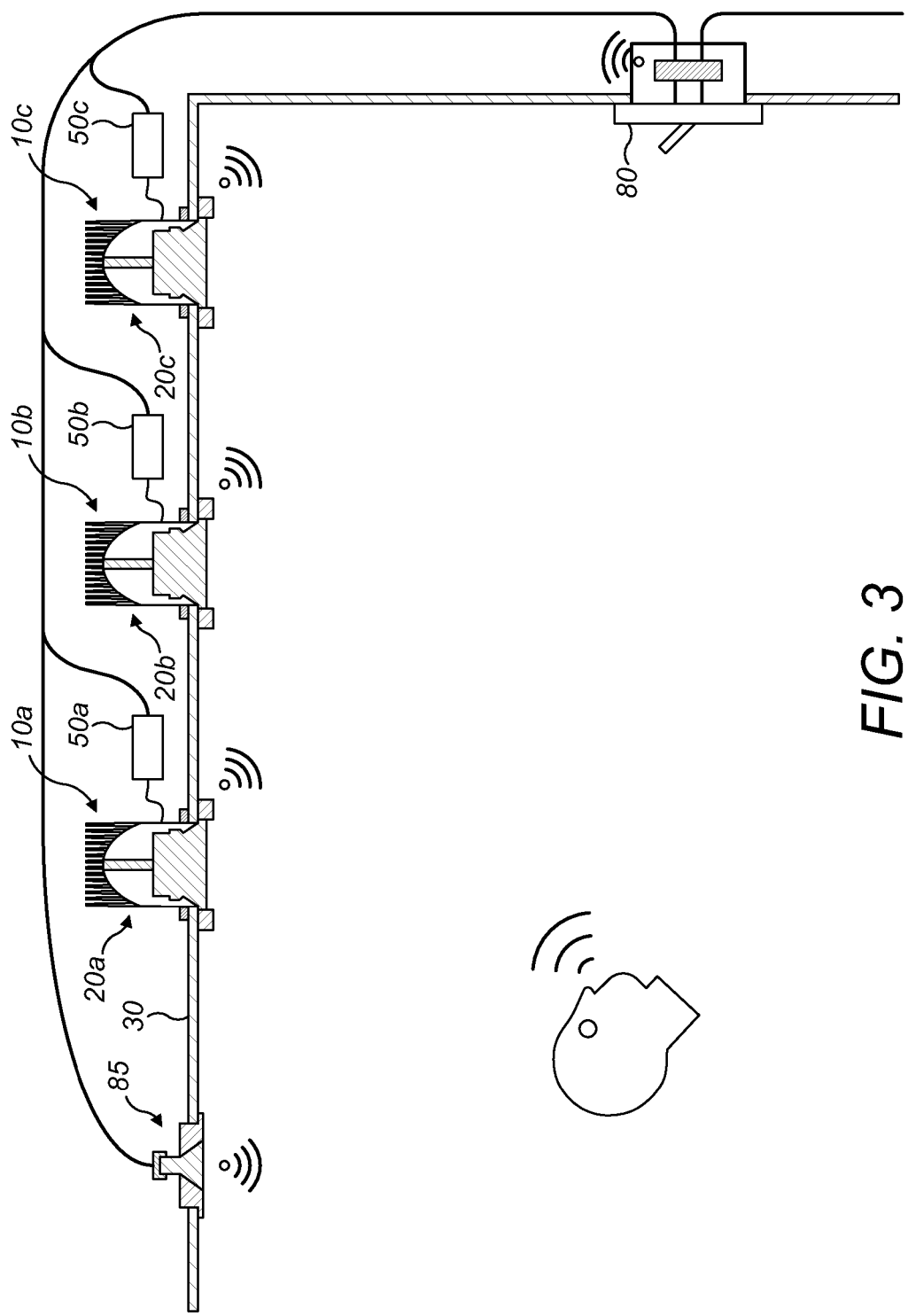
FIG. 3 shows a system, in schematic form, including three of the combined light and loudspeaker devices of FIG. 2 and a light bulb that includes a wireless transmitter/receiver (smart bulb).

FIG. 3 shows a system, in schematic form, including three combined light, loudspeaker and user input detector devices 10a, 10b, 10c of FIG. 2 and a light bulb that includes a wireless transmitter and/or receiver (smart bulb).

Figure 4B:
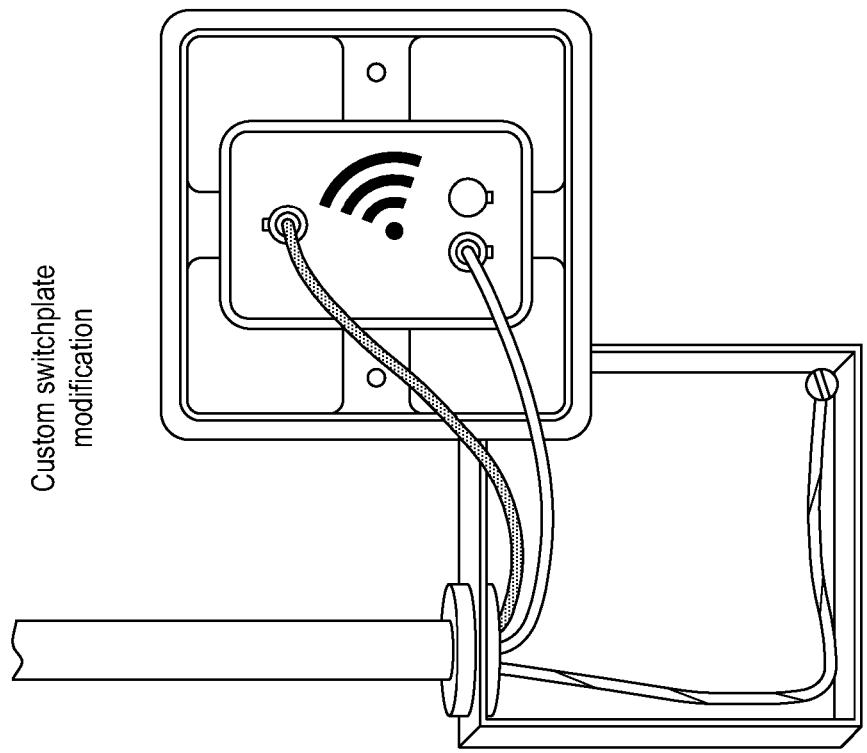
FIGS. 4a and 4b show two possible wireless switch modifications.
Figure 4A:
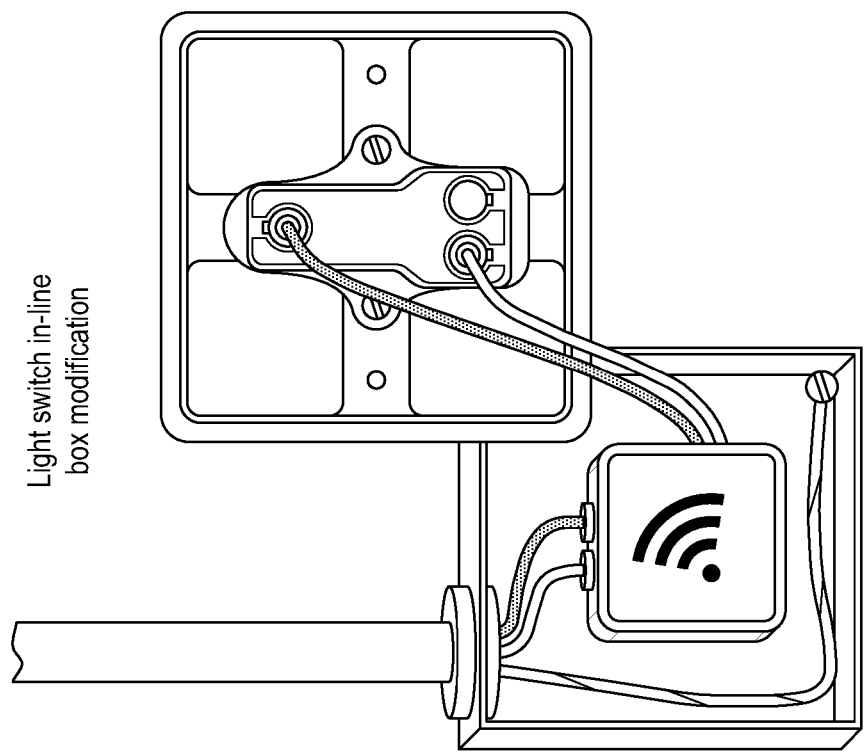

FIGS. 4a and 4b show two possible wireless switch modifications.

The system of light, loudspeaker and microphone devices may further include one or more switches. These switches are preferably installed alongside or in place of standard switches that were used to control the original lighting system. Advantageously, because no additional wiring is required, the switches may be installed easily. As shown in FIG. 4a, the switch modification is preferably provided by a small module that is installed behind the existing switch plate. Advantageously, this configuration allows installation of the system, without replacing the existing switch plates. This may be of benefit for cost and/or aesthetic reasons, for example. Alternatively, the previous switch plate may be replaced with a new switch plate, as shown in FIG. 4b. This may allow installation of more advanced control panels, if required.

If the existing switch plate and/or switch casing is metal it may impede the signal of the module. In order to overcome this, the antennae of the module may be placed in a tab or spacer that separates the switch plate from the wall very slightly.

In contrast to switches provided in standard lighting systems, a wireless enabled switch as shown in FIG. 4a or FIG. 4b is configured such that power to the devices is always available (unless the user performs a special operation, for example a reset operation). The previous wall switch (which was configured to cut power to the lights) is converted to a remote (which is configured to provide signalling to the devices while allowing the devices to draw power, even when the lighting elements of the devices are off). A switch according to FIG. 4a or FIG. 4b would not actually cut the power when the switch is toggled. It would instead transmit signals to the devices instructing them to enter a particular state. For example, the switch may instruct the devices to activate or deactivate the lighting elements or use only very little power, while still maintaining a power supply to the devices. This allows the loudspeaker elements of the devices to work, even when the lights are off. Alternatively, the switch may be configured to update the home profile directly. In this way, the switch may be able to affect the room and the home profile.

The switch may additionally or alternatively include a dial that can be used to dim the light, rather than simply provide a binary on/off switch. Moreover, the switch may include a microphone to improve the ability of the system to provide control using voice commands.

The loudspeaker and microphone may be independently controlled to enter low power states. In a low power or standby mode, the devices will preferably have all individual elements in low power mode. In this mode, the device will preferably still be able to receive an instruction to enter a different mode (so that the elements of the device can be reactivated, for example). In this way, the system does not use power unnecessarily. This mode may be used when the user is not home. If the whole system is placed in a low power or standby mode, a small number of devices may remain at least partially active so that the system may sense when the user returns home or to provide security functionality, as will be discussed later.

As indicated in FIG. 3 the system may further include one or more smart bulbs. Optionally, the system may further include combined light and loudspeaker devices (for example, combined light and loudspeaker devices are described in GB patent application number 1503426.7). These devices may also be controlled by the one or more switches. The smart bulbs and/or light/loudspeakers may be controlled by the same switch as one or more of the combined light, loudspeaker and microphone devices. Alternatively or additionally, the smart bulbs and/or light/loudspeakers may be controlled by further switches in the same switch plate. These devices may also be controlled by switches in separate switch plates installed elsewhere.

Advantageously, a more configurable system may be provided in this way. In standard lighting systems (or smart lighting systems that rely on an existing switch to control the power to the devices), the switches can only control those light fixtures that they are directly wired to. In contrast, the system of the present invention controls the lighting elements of the devices with control signals, rather than by physically breaking the circuit to prevent flow of power. The system may therefore be configured to enable lighting elements of each combined light, loudspeaker and microphone device to be controlled by whichever switch is preferred by the user.

The switch could be configured to control lights in one half of a room with one switch and the other half with a second switch. Individual devices could be reconfigured to be in the first or second half, as required.

Moreover, users sometimes desire that a set of lights may be controlled by more than one switch (for example, a switch at the top and the bottom of a set of stairs). In a standard system, a wire connecting the two switches would need to be installed and the single pole, single throw (SPST) switches would need to be replaced by single pole, double throw (SPDT) switches. Additional wiring is and more complicated switches are further required if the number of desired switching points is increased to three or more. In a system that includes two or more wireless enabled switches, the desired switching configuration can be easily implemented, without the need for any rewiring.

Many wireless enabled switches that are currently available for lighting systems are not capable of providing full switching functionality. For example, these systems may allow the user to dim the bulb but not actually turn the bulb off completely. This is because retrofit wireless enabled dimmer switches such as those of prior art systems are designed to be operable with standard light fixtures (light-bulbs). As a result, turning off the bulb (so that no power is flowing) would result in total loss of power to the wireless enabled switch module (which is installed in series with the bulb) and the module would no longer be able to communicate with the wireless controller (for example, a smartphone).

Currently available behind-switch wireless enabled dimmer modules are often intended to allow the user to either use the existing switch (or dimmer) as a physical input and also allow the user to control the lights by way of a wireless signal from a device (such as a smartphone). In order to enable the user to connect wirelessly to the dimmer module, the dimmer module needs to remain powered at all times. One method that was unsuccessfully trialled to address this issue is keeping a small amount of power supplied to the devices at all times. The action of physically switching the switch to off tells the module to supply only a small amount of power to the light circuit, usually just the bare minimum required so that power is still supplied to the dimmer module. These modules are usually provided in systems containing standard bulbs and so the small amount of power still running through the circuit may result in the bulbs being slightly illuminated, albeit dimly. Such problems are not present in systems according to the claimed invention. This is at least because the devices are able to receive instructions to turn the lights off completely, while still receiving power.

Previous lighting systems may include wirelessly controlled bulbs in the ceiling that need power at all times. A microcontroller in the "hue bulb" tells the LED elements to turn on or off. If the user turns the circuit off at the wall, it is then no longer possible to control the lights by way of a wireless remote. With this hue system, the wall switch is typically always turned on and a separate controller is used to turn the lights off.

The switch 80 may be electrically connected to devices via one or more control boxes 50. The switches and lighting devices share the same power line but the control signal is preferably transmitted wirelessly and so is decoupled from the power supply wires. The action of the switch does not directly affect the flow of power to either the devices or the switch unit. It provides a system input. This is necessary because the switches and devices share a common power supply circuit because they make use of existing wiring infrastructure. The switches may therefore enable the user to control the power to the light elements of the combined devices, without affecting power to the loudspeaker and microphone elements. Advantageously, the user may then turn the lights off while continuing to supply power to the speaker and microphone elements. For example, this may be desired if the user is watching a film. Additionally or alternatively, the switch may be used to control the power to the light, loudspeaker and/or microphone elements independently. This may be through additional physical switches and/or sliders on the switch plate and/or signals received wirelessly by the switch or any other device in the network (for example from software on smartphone or computer applications or from dedicated remote controls). This is explained in more detail below.

This system allows control of the lights and loudspeakers using this physical switch. This is particularly useful when it is not appropriate or possible to use voice commands. For example, this may be required when loud music is playing or when discretion is required (such as when a baby is sleeping).

The switch 80 comprises a switch plate. The switch plate is connected to a wireless network as it comprises a wireless transmitter and/or receiver. This wireless transmitter/receiver can either be on the outside of the switch plate or in-line behind the switch plate. Alternatively, the wireless transmitter/receiver, although most conveniently positioned or located on or in the switch 80, could be located elsewhere (for example, as a separate unit within the ceiling void, formed as a part of the control box 50, and so forth). This would advantageously overcome potential issues of poor signal quality due to shielding by the metal casing or of the switch. However, such an arrangement may require additional wiring to be installed. The wireless transmitter/receiver may also be used to stream audio to the device (or devices) wirelessly. As the control box 50, light source 110 and loudspeaker driver 20 of the combined light and loudspeaker driver device 10 are continuously powered, almost any wired power line protocol (for example PLC, X10 and the like) and/or wireless protocol (for example, BLE, Bluetooth EDR, 802.11 "WiFi"®, ZigBee, Z-Wave, LowPan and the like) can be used to connect the switch 80 to the combined light, loudspeaker and microphone device 10.

Each of the control boxes 50a, 50b, 50c of the devices 10a, 10b, 10c and the smart bulb 85 are electronically connected via the same circuit to switch 80. This enables the light source 110 of each device 10a, 10b, 10c and the smart bulb 85 to be switched on/off by the switch 80 without affecting the loudspeaker driver 20a, 20b, 20c of the devices 10a, 10b, 10c. The switch 80 can also be rewired such that it does not interrupt the power supplied to the light source 110 of each device 10a, 10b, 10c and the smart bulb 85. The wireless transmitter/receiver can be configured to digitally sense the switch state so as to control the loudspeaker drivers 20a, 20b, 20c of the combined light and loudspeaker driver devices 10a, 10b, 10c. Thus, the switch function is translated from a physical to logical circuit.

One additional function that may be performed by the switch is that of a hard reset or manual override of the system. This may be necessary if the system is in an unexpected state. This may be activated, for example, by toggling the switch two or more times in succession.

Any switch event is communicated to the required devices (depending on the configuration of the system). An event may simply consist of a change of state of the switch or may be a multiple toggle, as discussed above. Other events (such as faults in the switch) are also possible and may be communicated as required. The events are preferably communicated wirelessly (for example, using Bluetooth, Bluetooth Low Energy, WiFi, ZigBee, Z-Wave and the like) to the appropriate part of the network. Wireless communication is preferred because messages may be reliably transmitted to devices that are not physically wired to the switch (for example, the room controller or house controller).

It is also possible for the switch to communicate using wired connections (for example a power line connection). This may be useful where the switch is part of the same lighting circuit as the required destination device of the event data (for example, the room controller). In this case, wiring between the devices is already present and may be used to communicate data. This communication may be between a switch and devices on the same lighting circuit and/or from device to device. In such an embodiment, only one device on the lighting circuit (preferably the room controller) needs to communicate wirelessly with other parts of the network, in order for the system to be fully connected. This may reduce communication overheads of the system.

In practice, wireless communication may be preferable to power line communication (PLC). This is because PLC relies on existing wiring infrastructure and requires additional specialist hardware in the switches and devices. This hardware can be expensive. Power wires can also be subject to interference (as the wires are often unshielded and so act as an antenna) and so the communication link may be less reliable. Moreover, PLC requires power to be flowing through the wires in order to operate effectively. This can increase the power requirements of the system and/or result in a less reliable system.

As mentioned above, a wireless enabled switch may be provided as a modification to a conventional light switch, either as an in-line addition behind the switch plate or a custom switch plate, which is connected to the wireless network. This allows the switch to be used to turn off the lights but not cut power to the device. This modification essentially allows the switch to become an input to the system. Additionally or alternatively, standalone switches may be provided as additional remotes, rather than as replacements for existing physical switches. These additional inputs to the system are preferably configured to communicate wirelessly with one or more devices from the network of devices so that further switching options may be provided. Power to these additional remotes may be provided in the form of mains wiring or batteries.

Figure 5A:
FIGS. 5a and 5b show combined light and loudspeaker devices, in schematic form, in accordance with further alternative embodiments of the present invention.
Figure 5B:
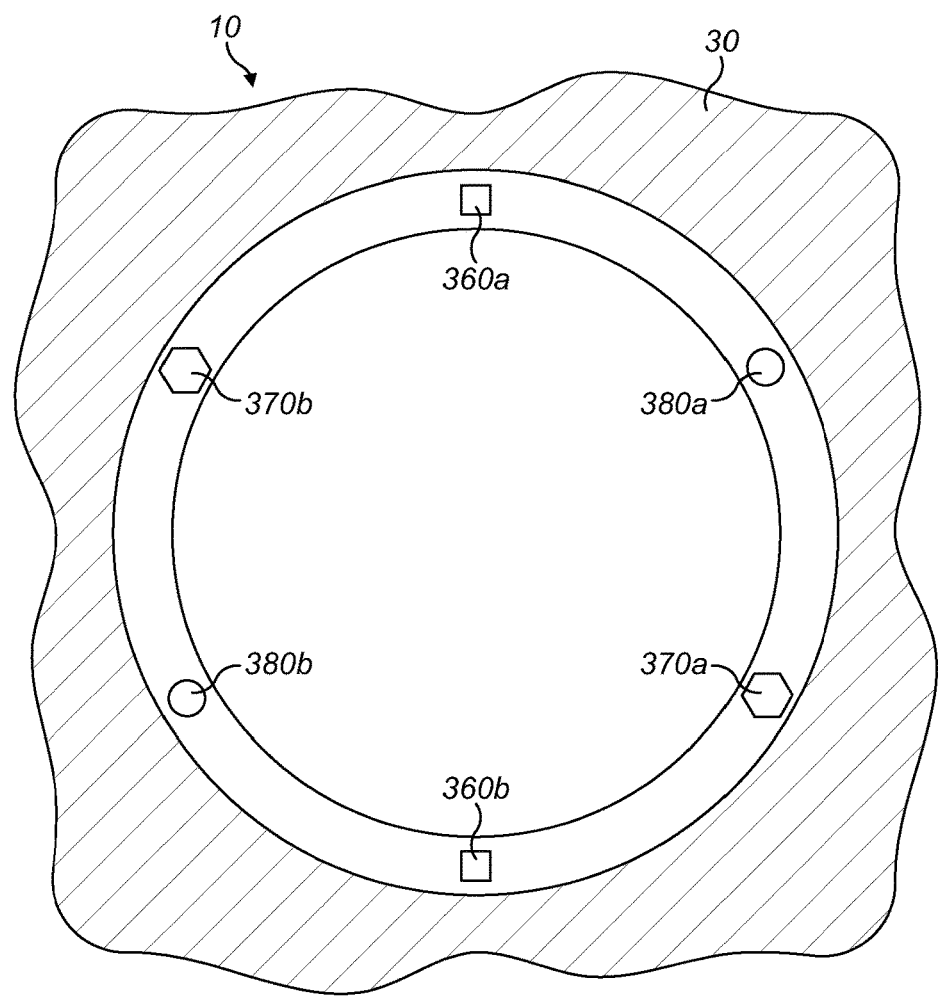

Various components can be configured to provide additional inputs to the system. FIG. 5a shows a schematic diagram of the combined light and loudspeaker driver device 10 comprising sensor 360, antenna 370 and microphone 380. FIG. 5b shows the cross-sectional view of the device of FIG. 5a. From this view it can be seen that the device 10 comprises two sensors 360a, 360b, two antennae 370a, 370b and two microphones 380a, 380b. The invention is not limited by the number of each of these components. The sensors 360a, 360b, antennae 370a, 370b and microphones 380a, 380b are mounted around a periphery of the aperture in which the device 10 is mounted. These components are mounted on a circuit board either within the room or in the void behind the ceiling. The sensors 360a, 360b, may be, for example, ambient light sensors, passive infra-red (PIR) sensors, or motion/occupancy sensors.

The device 10 of the various embodiments described may be installed in the same manner as state of the art in-ceiling lights, in part because the audio parts of the device 10 are wirelessly interconnected. This is extremely beneficial because it allows installation without the need for a specialist technician.

Hardware

Figure 6:
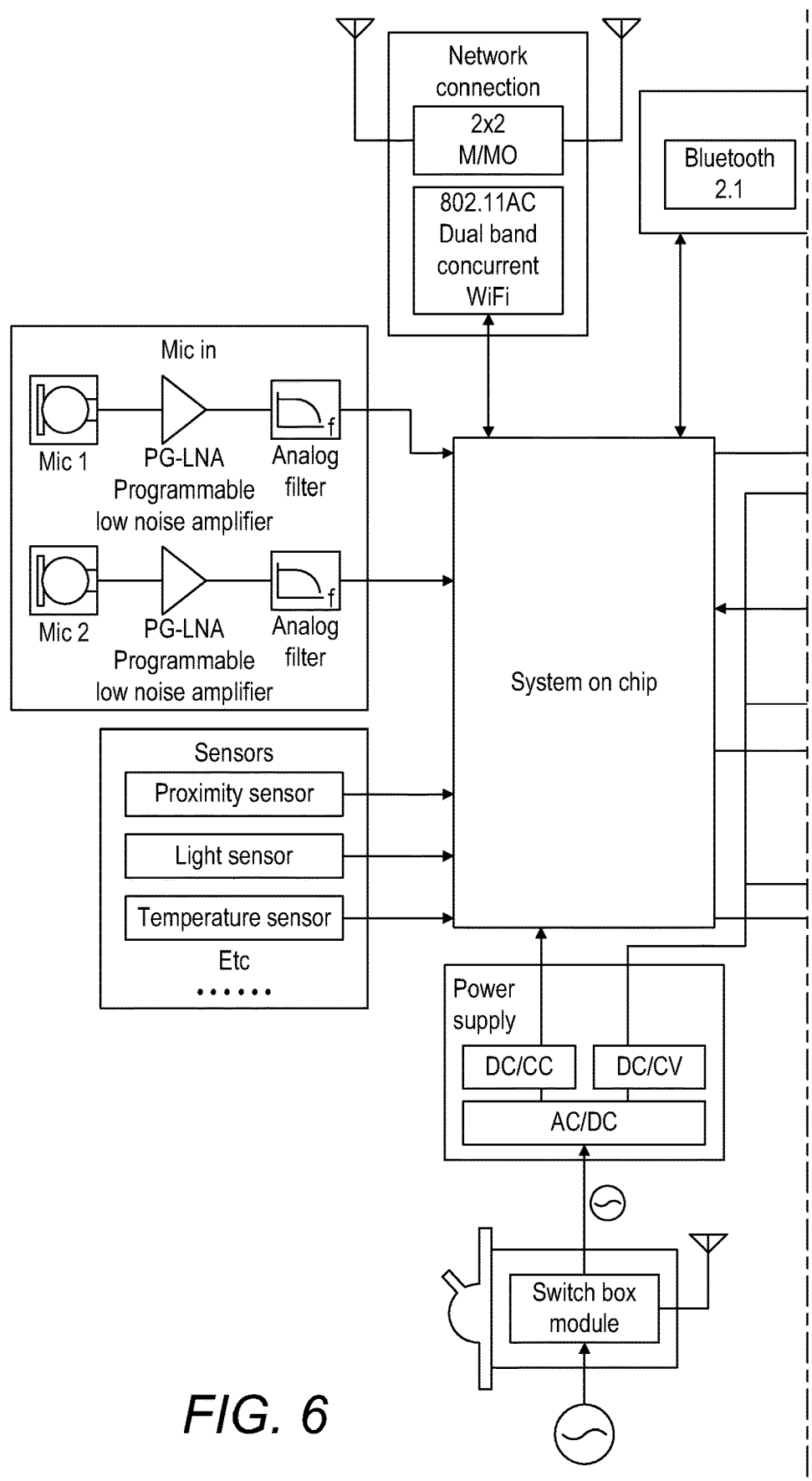
FIG. 6 shows a schematic diagram of a system containing a combined light, loudspeaker and microphone device and a switch box module.
Figure 6:
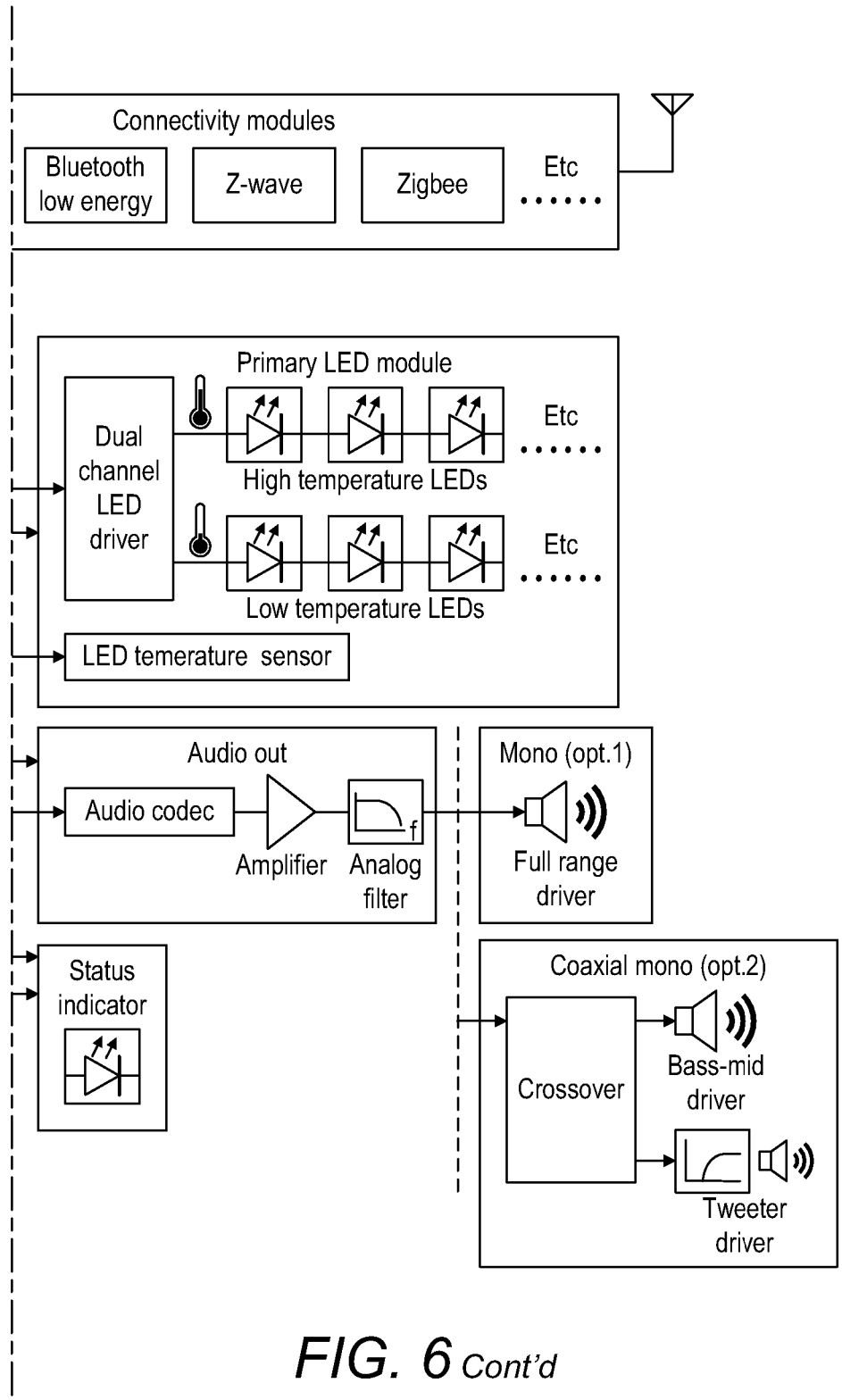

FIG. 6 shows a schematic diagram of a system containing a combined light, loudspeaker and user input detection device and a switch box module. As shown in this diagram, each combined light, loudspeaker and user input detection device will preferably comprise 2 microphones (though a configuration comprising only 1 microphone is also possible). These microphones may transmit audio data to the room coordinator unit or house coordinator unit. For example, the room coordinator unit may receive audio information from all the devices in the room and then use the best recording to process the audio command. Alternatively, the room coordinator may perform audio processing on the basis of recordings from multiple devices. This "aggregation" of audio data may be used to improve the signal to noise ratio of the audio signal. Alternatively, audio may be processed at each device and information may be transmitted to a coordinator unit if the device determines that there is information content in the audio signal. For example, this may be because the user has issued a voice command. The device may transmit raw or compressed audio data to be analysed elsewhere or it may process the audio itself to identify if the audio is a voice command. This may also include matching the command to a command contained in the vocabulary of the system.

Moreover, the room or house coordinator may instruct the devices to temporarily transmit their microphone data (for example, this could be used to determine the geometry of the rooms by echo location or to determine the physical distance between devices). Devices may also transmit data from their microphones to the network if they detect an audio signal that has been emitted by one of the other devices in the network, without any prompting from a coordinator unit. This may be useful, for example, for identifying the physical location of devices in the room or for identifying a device that has been disconnected from the wireless network.

Devices may also use audio signals for securely sharing wireless network keys with devices that are being added to the network (a potential hacker would need to be inside the room to intercept the transmission). The devices may also communicate with other nearby devices using light signals (Li-Fi). This provides a further method of sharing information securely with devices in close proximity so that the network may be flexibly adjusted when devices are added to or removed from the network of devices.

The microphones of the devices may be used to transmit audio from the user during a telephone call. For example, the user may initiate a telephone call using a voice command and then use the microphones in the system as a hands-free set. A cloud service may be used to make the call and the user therefore does not need to have a telephone on their person in order to make the call. Moreover, voice recognition may be used to identify the person making the phone call. Personal settings may therefore be applied accordingly.

Advantageously, audio from many different devices, each of which may have multiple microphones, may be transmitted to the room or house coordinator during a voice communication. The room or house coordinator may then use the different data streams to select the best audio to transmit or to perform audio processing (for example, to amplify audio coming only from the location of the user). This may be beneficial to compensate for acoustic effects caused by the geometry of the room or to maintain audio quality as the user moves into a different room.

Previous systems used the volume of the audio received by the microphones in the system to determine where the user is located. In such systems, the loudest stream is transmitted on the phone call. This does not always result in the audio stream of highest quality being used for the telephone call. In contrast, this system makes use of audio streams from multiple microphones and processes the audio to provide a stream with improved audio quality from a combination of the best quality audio signals, rather than simply the loudest. Noise cancellation and other audio techniques may also be applied through the use of multiple streams, as described elsewhere.

The audio from the other party (or parties) to the telephone call is preferably played through the speakers in the vicinity of the user.

This system of transmitting audio data from the user has further uses in addition to telephone calls. For example, the system could set up a communication between two users in different rooms of the house (in other words, an intercom system) or use the speakers to provide a home-wide announcement from a particular user (a public announcement system). Transmission of audio signals could also be used to monitor a particular room in the house from another room. For example, the system could be used as a baby monitor.

The audio data from the microphones may also be used for detecting the location of objects in a room or to detect motion. In order to facilitate this, the system could make use of echo location to detect features in the house or movement.

The system may also include additional sensors, such as light sensors, motion/occupancy sensors, temperature sensors and/or video cameras.

As shown in FIG. 6, the device also comprises a network connection part that allows the device to communicate wirelessly with the user's home router, the switch and other devices in the network. In FIG. 6, this is shown as an 802.11

AC WiFi® connection but other wireless protocols are possible. The device may also comprise one or more connectivity modules that implement these different wireless protocols. Connectivity modules for wired connection (for example over the power lines) may also be provided.

The device also comprises an LED driver and a plurality of LEDs. As can be seen from FIG. 6, this may be a dual channel LED driver for high temperature and low temperature LEDs. A physical temperature sensor and colour sensor for the LEDs is also provided. The colour temperature control provided by the warm and cool colour LED arrays is cleaner than that provided by a standard three LED system (using red, green and blue LEDs).

As shown in FIG. 6, the device also comprises an audio out module with an audio codec, an amplifier and an analog filter. This will produce the audio signal that is sent to the driver. The driver may be a full range driver. Alternatively, a crossover may be provided to send signals to a bass-mid driver and a tweeter driver. The bass-mid driver may be a driver for low to middle frequencies up to around 2 kHz or 3 kHz and the tweeter driver may be a driver for high frequencies above around 2 kHz or 3 kHz.

Chip

Figure 7:
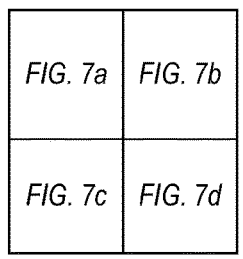
FIG. 7 shows a system diagram of a combined light, loudspeaker and microphone device.
Figure 7A:
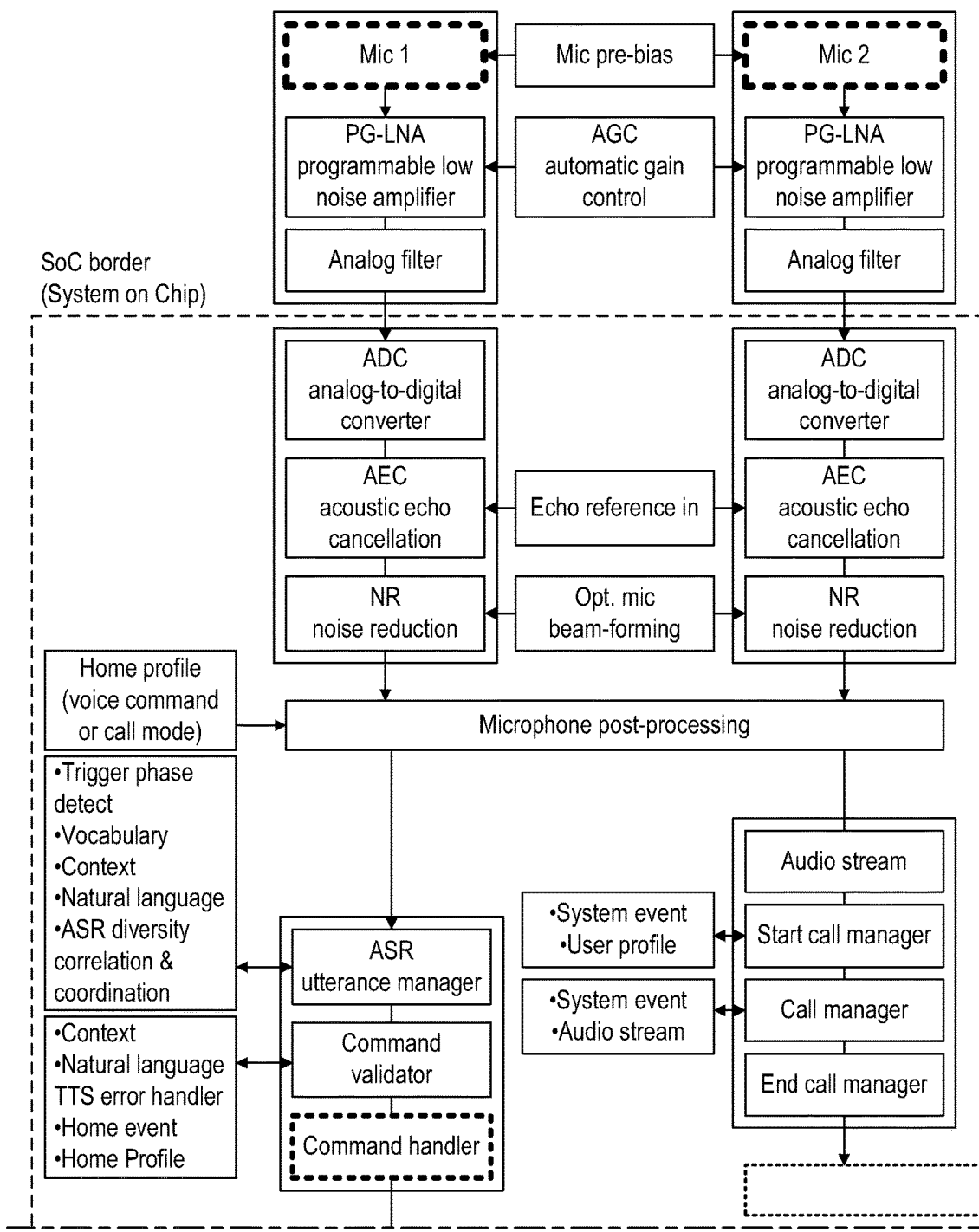
Figure 7B:
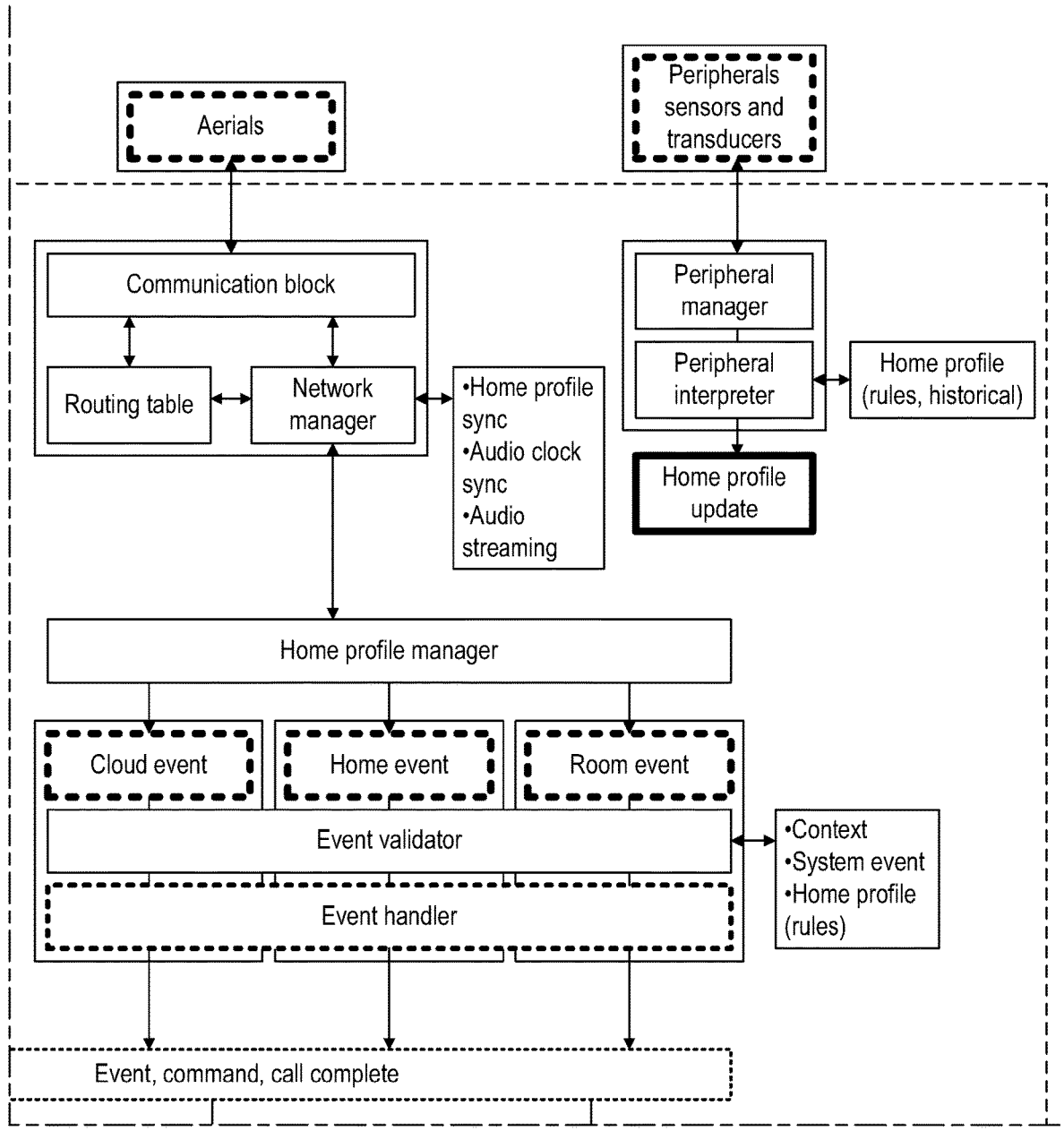
Figure 7C:
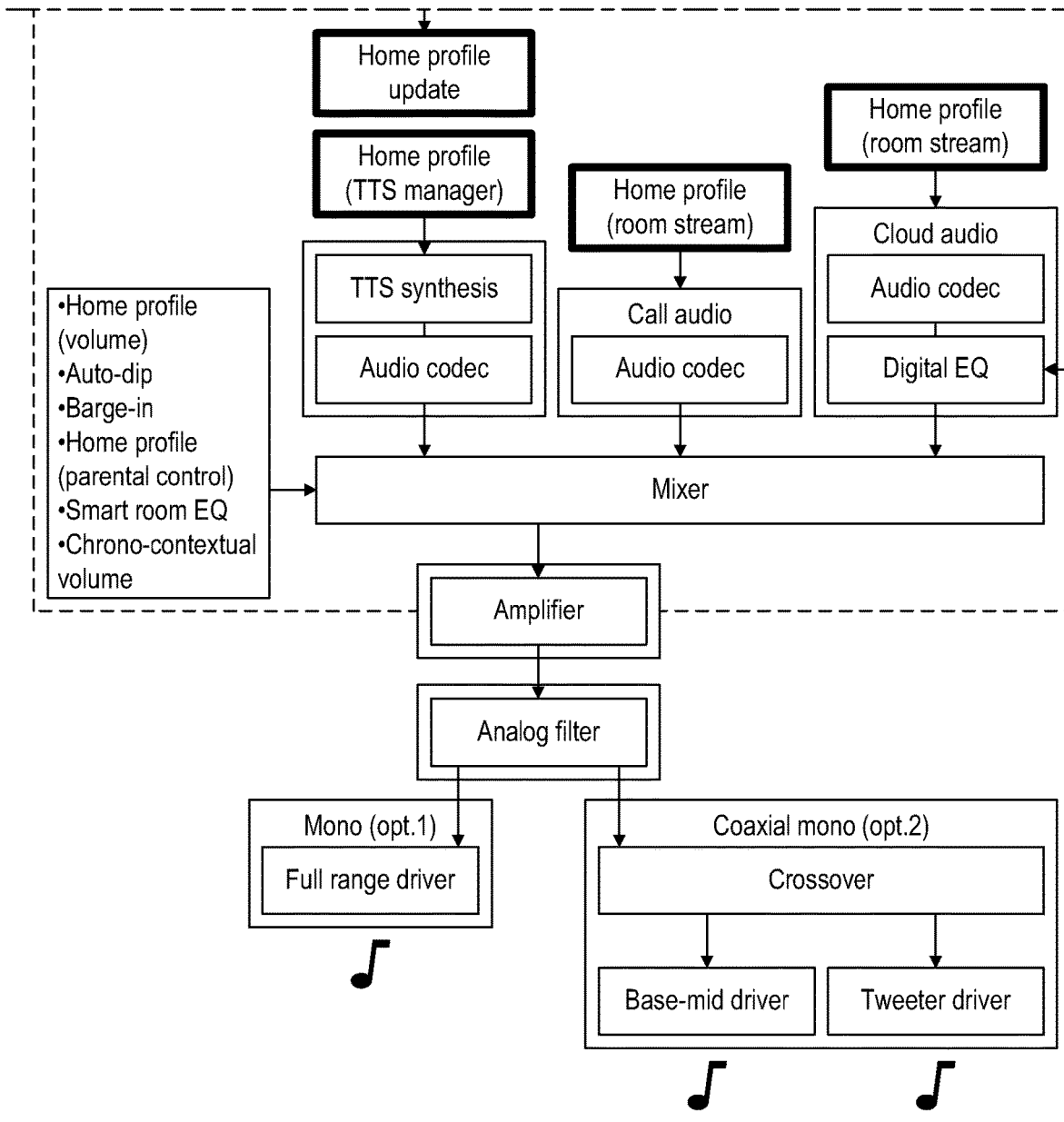
Figure 7D:
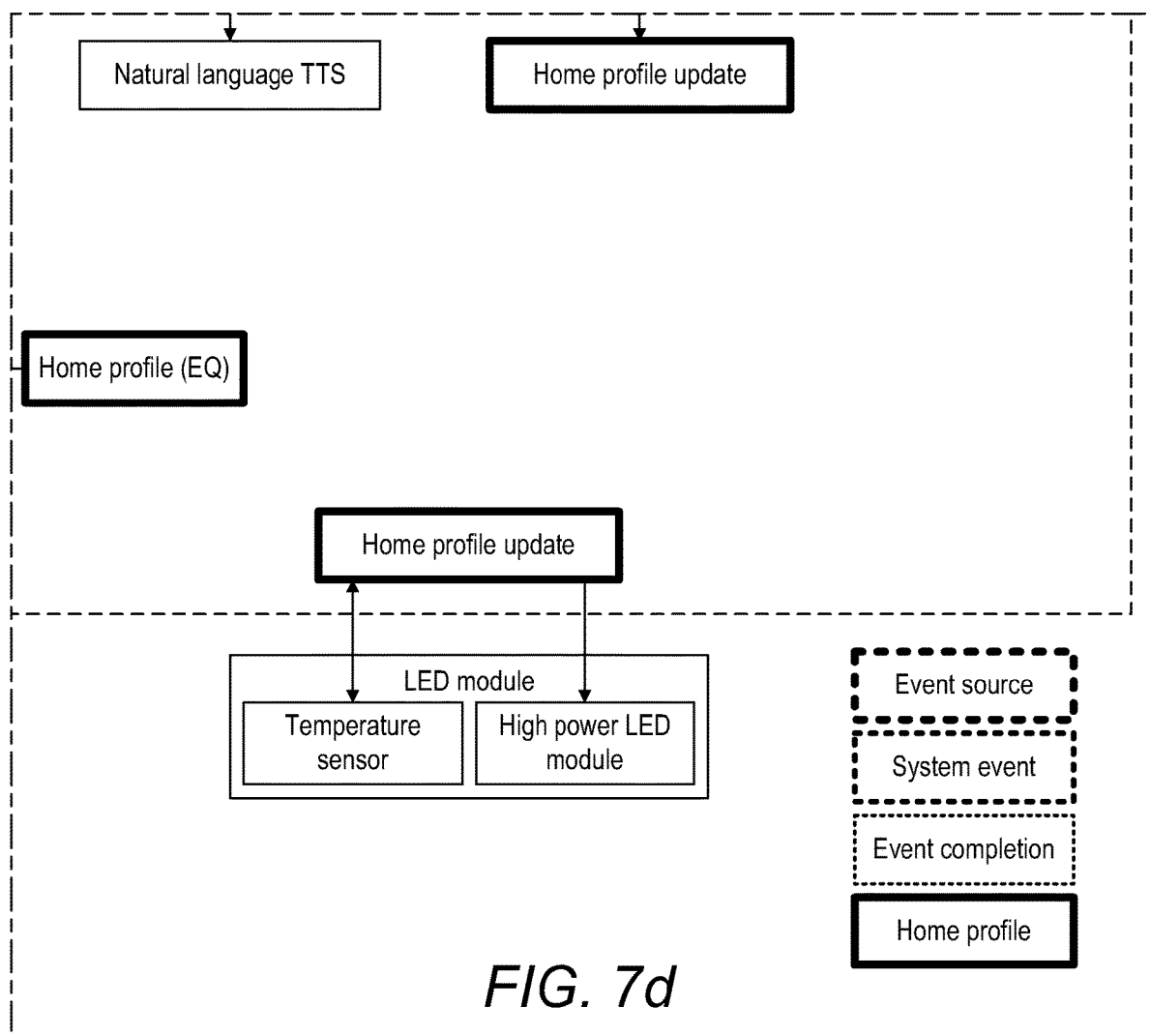

FIG. 7 shows a system diagram of a combined light, loudspeaker and microphone device. FIG. 7 also shows the flow of information between inputs and outputs of such a device, including the system on chip (SoC) border. Each device preferably has an integral controller SoC (housed inside the light speaker enclosure), which receives DC power from the power supply unit. Alternatively, the SoC may be contained within the power supply unit of the device and wired to the light, loudspeaker, microphone and other sensor elements of the device. Preferably the SoC is located in the housing, away from the power supply. This is because heat from the power supply may negatively impact the chip. This also enables the power supply to be used for multiple devices.

As can be seen from FIG. 7 each combined light, loudspeaker and user input device is powered by a chip that includes several processing blocks configured to generate and respond to events and inputs in order to generate outputs.

As previously mentioned, the device is equipped with at least one user input detector. This is preferably a microphone to detect audio signals but this could alternatively be a movement detector, video camera, and/or a biological sensor such as heartrate monitor. The output from the microphone is provided to an analog to digital converter. Data is then digitally processed using an echo reference to remove undesirable echoes in the signal and various noise reducing techniques are applied to the signal to improve the quality. Multiple microphones may be provided in an array on the lighting and sound device and beam forming techniques may then be applied. In other embodiments, this may be performed using data from many such devices.

Moreover, aggregating data from multiple devices can have additional benefits. For example, multiple devices could improve the reliability of the voice recognition or the signal to noise ratio of audio data for intercom or telephone calls. Listening capability is improved as more devices are added to the network. This is at least because the system can start to "crowd-source" probability-weighted data from multiple devices. In this way, a central holistic engine may determine the most likely speech with much greater accuracy. Moreover, beam forming may be applied to audio signals in order to determine the point in space a sound came from and to work out the identity of the user that has spoken.

Moreover, the system may be able to use audio information from multiple inputs to distinguish and separate different phrases that are spoken simultaneously by different users.

Additionally or alternatively, audio data (like voice commands) could be provided to the system by a satellite device that is part of the network. For example, an app on a mobile phone or wearable device like a smart watch could provide additional audio data to the system. The quality of such data may in some cases be better than the data collected by the combined light and loudspeaker devices. For example, if the room is noisy then audio data from a command spoken into a smart watch may be more easily processed than audio data detected by one or more devices that are further away.

As mentioned above, the user input detector may be a camera with infrared capability. Such a device is capable of measuring movement, gestures, the identity of users and heartrate (by monitoring fluctuations in skin colour or temperature). The system may further include wearable monitors, which provide further biological data to the system. For example, the system may further include wearable heartrate or brainwave monitors.

The "home profile" shown in FIG. 7 is the output and input for many of the data flows between input and outputs. As previously mentioned, the home profile is the overall database of the current state of the devices in the system. The home controller takes charge of the home profile. FIG. 7 also shows what happens to the audio steam for a voice command or a text-to-speech "TTS" input that is processed locally, and a "call". A call is an audio stream sent for intercom or voice call applications.

Further Applications of the System

As described above, it is a goal of the present invention to provide a system of lighting and sound devices that is able to fulfil the roles of several individual systems in one package that is easy to install. Advantageously, an integrated system is provided which provides speakers, microphones and lights in every room. This is provided in a way which is simple to install and provides an easy method for the user to control all components.

An audio system that is controllable to operate in one or multiple rooms is provided. The devices are controlled by a central coordinator to allow control (for example, volume control) of devices on an individual, per room or house-wide basis. The audio system is further controllable to produce desired effects in certain areas. For example, surround sound and/or noise masking/cancelling.

Privacy can be created for the user by providing noise masking to make speech unintelligible. This is achieved by adding white noise to the audio data picked up from the microphones or by playing white noise through the speakers so that microphones cannot detect audio. One additional application of noise masking is to reduce the effect of irregular background noise in a room like traffic and noise from neighbours. This may be achieved by playing audio through the speakers to partially counteract the background noise in the room. This can be used to aid sleep. Noise masking can also be used to partially remove or modify an unpleasant regular tone like a hum or roar to make it sound less intrusive. These applications of noise masking may all be self-calibrating. These techniques have applications in both commercial and residential environments.

True noise cancelling may be possible in deployments of the system with enhanced speaker configuration. In order to achieve this, the system would need to accurately calculate the position of the listener's ears in space and the source of the noise. The system would then need to generate the opposite signal to the noise to cancel it out.

A lighting system that that is controllable to operate in one or multiple rooms is also provided. As with the audio system, the devices are controlled by a central coordinator to allow control (for example, brightness control) of devices on an individual, per room or house-wide basis. The audio system is further controllable produce desired effects in certain areas. For example, mood lighting or task lighting.

A user input detector is further provided on each device so that the system is able to respond to input from a user, whatever the user's location is within the house (as long as the user is within range of the system).

The integration of these separate systems into a combined system gives rise to a considerable synergy that is not provided in any previous systems.

The system is able to receive commands and respond to them. Because of the integrated network of inputs and outputs a user may receive confirmation of their input or receive a response to it so that they can be reassured that the system is operating correctly. For example, the user may request the system to search for a recipe, which could then be read back to the user, with no need for the user to go to a computer. This may be particularly useful if they have wet hands.

After receiving instructions from the user, the system may simply execute the instruction immediately, without any further interaction with the user. Alternatively, a confirmation may be provided to reassure the user that the command has been executed. This may be in the form of an audio message. Alternatively, if the command was not understood, the system my intelligently read back instructions, wait for confirmation or clarify that the command was received correctly. This may be performed in a useful "human" way. In another additional or alternative arrangement, the system may use a nearby screen to display the information.

Another example could be a voice command to change the lights to a pre-set mood setting. The system could then respond by either activating the setting or playing an audio message to indicate that that particular setting was not found in the user's preferences. Visual cues could also be used to indicate success of commands. For example, an instruction to enter silent mode could be confirmed by a small lighting change. This feedback provides an enhanced user experience.

A status light with brightness that would not damage the users eyes if they were to look directly at it for long periods may also be provided. Such a status light may be used to give feedback to the user of the system, for example, to indicate success of commands. This may be beneficial for providing feedback to users of the system who are hard of hearing. Feedback could also be given to the user via a remote control or an application on a personal communication device, generating a haptic vibration, audio or visual cue.

User inputs are not limited to voice commands. Another possible user input to the system could be movement. For example, a user may make a physical command or "gesture" to the system which detects the movement and adjusts the volume of the speakers accordingly. This could be done with a separate movement detector or could be done using the combination of microphones and speakers in a sonar system, as discussed below.

The combination of speakers and microphones allows the system to perform enhanced functions that would not be possible in previous systems. Features in the house may be detected by sonar to create a coarse three-dimensional map of the room/house, for example. This could be achieved without disruption to the user by using frequencies that are above the range of human hearing. This may be used to enable the system to calculate geometry of the room and use this information to fine-tune surround sound or lighting parameters. In other words, automatic smart room equalisation could be performed for both light and sound. One application of this is to configure the system to detect tables and/or work surfaces and provide task lighting automatically. Moreover, this could be used to provide an automatic nightlight for users.

The map of the room created using echolocation may also be used to tune parameters of the audio system to provide improved audio experience for users of the system.

Echolocation may also be used to detect the presence of a user in a room. This may then be used for a variety of functions, for example, to automatically turn on lights when a user enters a room, to provide ambient analytics and/or to direct intercom functionality to the correct location automatically. Presence detection of users may additionally or alternatively be performed by listening for sounds such as doors opening, footsteps of users and the like. Moreover, the system may include movement sensors, passive infra-red (PIR) sensors and/or pressure sensors, which could be used to detect presence of users.

One further application of this system is to provide a security system. The system of microphones throughout the house could be used to detect intruders in a similar way to how the system detects presence of users. This may be performed by detecting noise, by using echo location and/or by using additional sensors.

Echolocation may also be used to determine gestures made by users. Recognition of gestures may be used in addition to voice command to provide inputs to the system to control the light and/or loudspeaker elements of the devices. Recognition of gestures may also be provided by motion detectors, passive infra-red (PIR) sensors, video cameras, and/or infra-red cameras in the devices, for example.

Video cameras in the devices may further be used to determine what was said by the user by lip-reading software. This may be used in combination with audio data from the microphone(s). This may advantageously allow the system to determine more accurately what was said by the user. Moreover, cameras may provide further information to the system regarding the location of users.

The system also preferably provides a means for the user to interact with third-party applications. For example, the system may provide a user interface for applications provided by Sonos®, Nest®, Amazon® and the like. The user may interact with these applications using the input detectors and may receive outputs via the speakers and/or the lighting elements. In this way, a listening computer that is always nearby is provided by the system. The system thereby acts as a platform or enabler for applications which can listen, produce sound (speech, music) or light in any room, and be part of the fabric of the home.

The system may further be configured to collect ambient analytics. This could be in order to acquire a long term analysis of sleep patterns, speech, movement and the like, for health reasons. With a collection of data required over time, the system would be better able to identify subtle behavioural changes and provide a wide range of personalised health recommendations.

One further application that could be implemented using this system is a "Push to talk" system. This enables the system to provide an intercom for the whole house. This may be useful, for example, if one user in the household would like to find out if the family needs more bread. They could simply use an application to transmit a live message to the whole house and hear any replies from other users present in the house. Advantageously, this provides a system that is much quicker than going around the house to locate people or telephoning them.

Throughout this description, reference is made to a "user's house" or "home" when describing this combined lighting and sound system. Whilst this system is primarily intended for domestic use, the advantages provided by the system may also be applicable in commercial environments. Example commercial uses could be in retail for music and announcements. The system could also be used for announcements in airports and the like. The system could be used anywhere there is a need for both light and sound. Measures may be in place to restrict who can control the system (for example, this may use voice recognition). Other possible uses include supplying privacy sound in open plan offices or medical locations. Commercial applications may require higher power speakers and light. More devices may be required in commercial environments. The scalable system described in this application would therefore be well suited.

What is claimed is:

1. A method of controlling a lighting and sound system comprising a controller and a plurality of lighting and sound devices and a controlling unit that includes a switch having an on position and an off position, wherein each lighting and sound device includes a light, a loudspeaker and a microphone, the method comprising:
   receiving an audio instruction from a first user of the system at the microphone of a first device of the plurality of devices;
   processing the received audio instruction;
   transmitting the instruction from the first device to the controller;
   executing an action based upon the processed audio instruction;
   communicating an indication of a position of the switch and/or a dial on the controlling unit from the controlling unit to the controller; and
   adjusting an optical output of the light of one or more of the lighting and sound devices based on the indication of the position of the switch and/or dial; and/or
   adjusting one or more audio parameters of the loudspeaker of one or more of the lighting and sound devices based on the indication of the position of the switch and/or dial,
   wherein the controlling unit is configured to facilitate supply of power to one or more of the lighting and sound devices when the switch is in the on position and when the switch is in the off position to facilitate control of the optical output and/or the audio parameters, without cutting power to the lighting and sound devices when the light and/or loudspeaker are switched off.

2. The method of claim 1:
   wherein executing the action comprises executing the action at the first device for control of the light and/or loudspeaker of the first device; and/or
   further comprising transmitting the instruction to a second device of the plurality of lighting and sound devices and executing the action comprises executing the action at the second device for control of the light and/or loudspeaker of the second device; and/or
   wherein the audio instruction comprises:
      a voice command,
      speech data,
      a percussive noise, and/or
      a musical or vocal tone; and/or
   wherein processing the received audio instruction comprises performing echo cancellation on the received audio instruction; and/or
   wherein each of the devices includes a second microphone and the method further comprises receiving the audio instruction at the second microphone and wherein processing the audio instruction comprises performing beam forming using the audio instruction received at the microphone and the second microphone; and/or
   wherein executing an action comprises playing audio through the loudspeaker of one or more of the lighting and sound devices; and/or
   wherein executing an action comprises adjusting an optical output of the light of one or more of the lighting and sound devices.

3. The method of claim 1 wherein the method comprises transmitting the instruction to an application running on a processor and executing the action comprises executing the action at the application.

4. The method of claim 3, wherein the application is an application for playing music and executing an action comprises playing audio from the application for playing music through the loudspeaker of one of more of the lighting and sound devices.

5. The method of claim 3, wherein the application is a search engine and executing the action comprises searching for a phrase specified by the first user in the audio instruction and delivering results to the first user.

6. The method of claim 5, wherein delivering results to the first user comprises processing results from the search engine, performing text-to-speech on the processed results to generate audio and playing the audio through the loudspeaker of one of more of the lighting and sound devices.

7. The method of claim 1, wherein the audio instruction comprises a voice command and/or speech data and wherein processing the received audio instruction comprises performing voice recognition on the voice command.

8. The method of claim 7, wherein processing the received audio instruction further comprises matching the voice command to a trigger phrase from a database of trigger phrases.

9. The method of claim 8, wherein executing the action comprises updating the database of trigger phrases.

10. The method of claim 1, wherein executing an action comprises initiating a voice communication between the first user and a second user.

11. The method of claim 10:
   further comprising transmitting audio information received by the microphone of one or more of the devices to the second user so that the second user can hear the first user; and/or
   further comprising transmitting audio information from the second user to one or more of the lighting and sound devices and playing the audio through the loudspeaker of the one or more devices so that the first user can hear the second user; and/or
   wherein the second user is a user of a telecommunications device and the voice communication is a telephone call; and/or
   wherein the second user is a user of the lighting and sound system.

12. The method of claim 1, wherein executing an action comprises adjusting one or more audio parameters of the loudspeaker of one or more of the lighting and sound devices.

13. The method of claim 12, wherein the audio parameters comprise equalisation settings.

14. A lighting and sound system comprising:
a plurality of lighting and sound devices, wherein each device includes a light, a loudspeaker and a user input detector comprising a microphone; and
a controller, in communication with each of the plurality of lighting and sound devices, the controller being configured to receive an audio instruction from the user input detector of one or more of the lighting and sound devices, and to execute an action based upon the audio instruction; and
a controlling unit that includes a switch having an on position and an off position, wherein the controlling unit is configured to communicate the position of the switch and/or a dial on the controlling unit to one or more of the lighting and sound devices, wherein an optical output of the light and/or one or more audio parameters of the loudspeaker of one or more devices is configured on the basis of the position of the switch and/or dial, and wherein the controlling unit is configured to facilitate supply of power to one or more of the lighting and sound devices when the switch is in the on position and when the switch is in the off position to facilitate control of the optical output and/or the audio parameters, without cutting power to the lighting and sound devices when the light and/or loudspeaker are switched off.

15. The system of claim 14:
wherein one lighting and sound device of the plurality of lighting and sound devices is configured as a house coordinator unit, wherein one or more of the lighting and sound devices of the plurality of lighting and sound devices is configured as a room coordinator unit, and wherein the house coordinator unit comprises the controller; and/or
wherein executing the action comprises controlling the output of the light and/or loudspeaker of one or more of the lighting and sound devices; and/or
wherein the user input detector of each lighting and sound device further comprises a programmable low noise amplifier, connected to the output of the microphone; and/or
wherein the user input detector of each lighting and sound device further comprises an analog filter, connected to the output of the microphone; and/or
wherein each device further comprises a second user input detector that comprises elements that are equivalent to those of the first user input detector and wherein the second user input detector is spaced physically apart from the first user input detector; and/or
wherein each lighting and sound device further includes a network connection module that is configured to communicate with the network connection module of one of the other devices and/or a network router; and/or
wherein each lighting and sound device further includes a network connection module that is configured to communicate with the network connection module of one of the other devices and/or a network router, and wherein the system is configured to wirelessly relay communications between one or more personal electronic devices and the network router; and/or
wherein each lighting and sound device further includes a connectivity module that is configured to communicate with the connectivity module of one of the other devices in the system; and/or
wherein each lighting and sound device further includes a connectivity module that is configured to communicate with the connectivity module of one of the other devices in the system, and wherein the connectivity module of each lighting and sound device is configured to communicate using a protocol selected from one or more of: Bluetooth; Bluetooth low energy; Z-wave; Zigbee; LowPan; PLCBUS; X10; and 802.11 "WiFi"; and/or
wherein the light of each lighting and sound device comprises an LED module; and/or
wherein the light of each lighting and sound device comprises an LED module, and wherein the LED module of each lighting and sound device comprises a dual channel LED driver, a plurality of high temperature LEDs and a plurality of low temperature LEDs; and/or
wherein the light of each lighting and sound device comprises an LED module, wherein the LED module of each lighting and sound device comprises a dual channel LED driver, a plurality of high temperature LEDs and a plurality of low temperature LEDs, and wherein the LED module of each lighting and sound device further comprises a LED temperature sensor; and/or
wherein each lighting and sound device further includes an audio out module; and/or
wherein each lighting and sound device further includes an audio out module, and wherein the audio out module of each device comprises an audio codec, an amplifier and an analog filter; and/or
wherein each lighting and sound device further includes an audio out module, and wherein each lighting and sound device further includes an audio driver, connected to the output of the audio out module; and/or
wherein each lighting and sound device further includes an audio out module, wherein each lighting and sound device further includes an audio driver, connected to the output of the audio out module, and wherein the audio driver of each lighting and sound device is a full range driver; and/or
wherein each lighting and sound device further includes an audio out module, wherein each lighting and sound device further includes an audio driver, connected to the output of the audio out module, and wherein the audio driver of each lighting and sound device comprises a crossover, a first driver for low to middle frequencies and second driver for high frequencies; and/or
wherein each lighting and sound device further comprises a status indicator; and/or
further comprising a power supply configured to provide a constant voltage and/or a constant current to each lighting and sound device; and/or
wherein each lighting and sound device further comprises a proximity sensor; and/or
wherein each lighting and sound device further comprises a light sensor; and/or
wherein each lighting and sound device further comprises a temperature sensor; and/or
wherein the loudspeaker of each device has a loudspeaker diaphragm and the light of each device is positioned radially inwardly of the loudspeaker diaphragm of that device; and/or
wherein each device further comprises a heat removal element; and/or wherein each device further comprises a heat removal element, and wherein the loudspeaker diaphragm of each device extends between a front and a rear part, the heat removal element of each device comprising a heat sink mounted behind the rear part of the loudspeaker diaphragm of that device; and/or wherein each device further comprises a heat removal element, wherein the loudspeaker diaphragm of each device extends between a front and a rear part, the heat removal element of each device comprising a heat sink mounted behind the rear part of the loudspeaker diaphragm of that device, and wherein the heat removal element of each device comprises a heat removal column in thermal connection with the heat sink and the light of that device, the heat removal column having a first, proximal end that is adjacent to the heat sink and a second, distal end that is spatially separated from the heat sink; and/or wherein each device further comprises a speaker grille mounted in front of a front surface of the loudspeaker; and/or further comprising satellite devices that are managed by the controller.

16. The system of claim 1:

wherein the controlling unit is configured to communicate the position of the switch and/or dial to one or more of the lighting and sound devices; and/or wherein the controlling unit is configured to communicate the position of the switch and/or dial to a database; and/or wherein the controlling unit is configured to communicate the position of the switch and/or dial to a database, and wherein one or more of the devices are configured to read the position of the switch and/or dial from the database; and/or wherein the controlling unit comprises a transmitter that is configured to communicate the position of the switch and/or dial to one or more of the devices; and/or wherein the controlling unit comprises a transmitter that is configured to communicate the position of the switch and/or dial to one or more of the devices, and wherein the transmitter is configured to wirelessly communicate the position of the switch and/or dial to the one or more devices; and/or wherein power to one or more of the lighting and sound devices is reset or turned off if the switch is toggled a predetermined number of times; and/or wherein a reset instruction is sent to one or more of the devices if the switch is toggled a predetermined number of times.

17. The system of claim 14, further comprising a power supply unit that is electrically connected to a lighting and sound device and configured to supply electrical current in one or more forms to the device.

18. The system of claim 17:

wherein the power supply unit is configured to supply a first form of current to power the light of the device and a second form of current to power the loudspeaker of the device; and/or wherein each form of current that the power supply unit is configured to supply to the device is either alternating or direct current; and/or wherein each form of current that the power supply unit is configured to supply to the device is supplied at a predetermined voltage; and/or wherein the power supply unit is configured to receive mains current; and/or wherein each device has a power supply unit and each power supply unit is physically located within or physically connected to a main housing of the respective device; and/or wherein the power supply unit is physically separate from the device; and/or wherein the power supply unit is physically separate from the device, and wherein the power supply unit is configured to supply electrical current to a plurality of lighting and sound devices.

19. The system of claim 14, wherein one lighting and sound device of the plurality of lighting and sound devices is configured as a house coordinator unit, wherein one or more of the lighting and sound devices of the plurality of lighting and sound devices is configured as a room coordinator unit, and wherein the house coordinator unit comprises the controller.

20. The system of claim 14, wherein each lighting and sound device further includes a network connection module that is configured to communicate with the network connection module of one of the other devices and/or a network router, and wherein the system is configured to wirelessly relay communications between one or more personal electronic devices and the network router.

* * * * *